United States Patent [19]
Ozaki

[11] Patent Number: 5,392,411
[45] Date of Patent: Feb. 21, 1995

[54] DUAL-ARRAY REGISTER FILE WITH OVERLAPPING WINDOW REGISTERS

[75] Inventor: Shinji Ozaki, Hyogo, Japan

[73] Assignee: Matsushita Electric Industrial Co., Ltd., Kadoma, Japan

[21] Appl. No.: 13,105

[22] Filed: Feb. 3, 1993

[30] Foreign Application Priority Data

Feb. 3, 1992 [JP] Japan .................................. 4-017353

[51] Int. Cl.⁶ ...................... G06F 12/02; G06F 13/00; G11C 11/34
[52] U.S. Cl. .................................. 395/400; 395/425; 395/DIG. 1; 365/230.03
[58] Field of Search ............... 395/400, 425, 775, 800; 365/230.03, 230.04

[56] References Cited

U.S. PATENT DOCUMENTS

| | | | |
|---|---|---|---|
| 5,050,067 | 9/1991 | McLagan et al. | 395/700 |
| 5,054,002 | 10/1991 | Ninomiya et al. | 365/233 |
| 5,083,263 | 1/1992 | Joy et al. | 395/425 |
| 5,159,680 | 10/1992 | Joy et al. | 395/425 |
| 5,179,681 | 1/1993 | Jensen | 395/425 |
| 5,179,682 | 1/1993 | Jensen | 395/425 |
| 5,208,783 | 5/1993 | Ninomiya et al. | 365/233 |
| 5,226,142 | 7/1993 | Vegesna et al. | 395/425 |
| 5,233,691 | 8/1993 | Ando et al. | 395/425 X |
| 5,276,820 | 1/1994 | Ikenaga et al. | 395/375 |

FOREIGN PATENT DOCUMENTS 3-219493 9/1991 Japan .

OTHER PUBLICATIONS

"The SPARC Architecture Manual", Sun Microsystems Inc., Version 8, 1990, pp. 23-27.

Primary Examiner—Jack B. Harvey
Assistant Examiner—Michael A. Whitfield
Attorney, Agent, or Firm—Willian Brinks Hofer Gilson & Lione

[57] ABSTRACT

In a register file having an overlap-window arrangement in which 64 registers are divided into eight windows W0 to W7 each containing 16 registers R0 to R15, memory cells are divided into two memory cell arrays, i.e., a first memory cell array containing registers R0 to R7 of odd-numbered windows (or registers R8 to R15 of even-numbered windows), and a second memory cell array containing registers R0 to R7 of even-numbered windows (or registers R8 to R15 of odd-numbered windows). Each of the registers has one read word line. According to the exclusive logical sum of the least significant bit of a window No. signal and the most significant bit of a register address signal, an output selection circuit selects one of two data simultaneously read from the two memory cell arrays. There is thus provided a register file which is small in circuit scale and assures high-speed reading.

6 Claims, 12 Drawing Sheets

DUAL-ARRAY REGISTER FILE WITH OVERLAPPING WINDOW REGISTERS

BACKGROUND OF THE INVENTION

The present invention relates to a register file having a plurality of general-purpose registers for temporarily storing data in a microprocessor or the like.

As one of the measures for enhancing the performance of a microprocessor, there has been recently proposed a register file using an arrangement of register windows. For example, "The SPARC Architecture Manual", Sun Microsystems Inc., Version 8, 1990, pp 23-27, sets forth the specifications of such a register file. According to the arrangement of such a register file, the register file having a plurality of general-purpose registers is divided, in whole or in part, into a plurality of windows, each window sharing some registers as double-address registers with the two adjacent windows. By switching the window, available registers are switched. The use of double-address registers located in the overlapping portion of two adjacent windows, enables data to be transmitted between procedures at high speed.

Each of the registers in each window is designated by an address to be determined by a combination of a window number which selects a window and a register address which indicates a relative position in a window. Each of the double-address registers has two different addresses. A window number is specified by a window number signal to be supplied from a window control circuit which controls increment and decrement of the current window No. A register address is specified by a register address signal to be supplied by a register address signal generating circuit based on register designating bits in an instruction from a microprocessor.

A conventional register file having the window arrangement above-mentioned, comprises an address converting circuit and a decoding circuit, in addition to memory cell arrays forming a plurality of general-purpose registers, and a window control circuit and a register address signal generating circuit which are of the types above-mentioned. In a register file having 64 registers for example, the address converting circuit is adapted to convert a window number signal and a register address signal into a 6-bit address signal by an operational processing. In view of the fact that each of double-address registers has two different addresses, the address converting circuit is adapted to convert different combinations of a window number signal and a register address signal into the same address signal. Based on a 6-bit address signal from the address converting circuit, the decoding circuit is adapted to assert one of 64 word lines to select a register in the memory cell arrays.

Thus, the conventional register file above-mentioned has the address converting circuit for executing an operational processing for converting a window number signal and a register address signal into an address signal. Accordingly, the time required for executing the operational processing leads to one of causes which prevent a register from being read at high speed.

DISCLOSURE OF THE INVENTION

It is an object of the present invention to provide a register file having an overlap-window arrangement which eliminates the operational processing for address conversion above-mentioned, thus enabling a register to be read at high speed.

To achieve the object above-mentioned, the register file according to the present invention is arranged such that memory cells for double-address registers are divided into first and second memory cell arrays, a window number signal and a register address signal are respectively decoded directly by two decoding circuits to read one data from each of the first and second memory cell arrays, and either one of the data thus read is selected by an output selection circuit. Accordingly, a register can be read with no intermediary of an address converting circuit for executing an operational processing based on a window No. signal and a register address signal. This results in high-speed register reading. Further, dividing the memory cells into groups shortens the read bit lines to lower the wiring capacitances thereof. This further speeds up reading of a register.

To decode data at high speed, memory cells for double-address registers may be suitably divided into first and second memory cell arrays according to odd- and even-numbered register addresses, and two read word lines may be suitably disposed for each register in view of double addresses. By way of example, the following description will discuss an arrangement in which each of the first and second memory cell arrays has J double-address registers. In this case, the first and second read decoding circuits are adapted to respectively assert one of 2J first read word lines for the first memory cell array and one of 2J second read word lines for the second memory cell array. At this time, the least significant bit of a register address signal is not used in both decoding circuits, but is used only at the time when an output data is selected by the output selection circuit. This reduces the number of bits of an input signal to each of the first and second read decoding circuits. This assures high-speed decoding and subsequently high-speed register reading.

To reduce the register file in circuit scale, there may be suitably adopted an arrangement in which the memory cells for double-address registers are divided into the first and second memory cell arrays such that those double-address registers in each window which are also contained in one adjacent window, are separated from those double-address registers in said each window which are also contained in the other adjacent window, and in which each register has a single read word line. By using a window number signal and bits of a register address signal other than the most significant bit thereof, a register to be read can be specified as either one register in the first memory cell array or one register in the second memory cell array. That is, although each register has two addresses, it is enough that each register has a single read word line. For example, when each of the first and second memory cell arrays has J double-address registers, the first and second read decoding circuits are adapted to respectively assert one of J first read word lines for the first memory cell array, and one of J second read word lines for the second memory cell array. Since it is enough that each of the two read decoding circuits asserts one of the J read word lines, the read decoding circuits can be reduced in circuit scale. Further, reading circuits in the memory cell arrays can also be reduced in scale. This reduces the entire register file in circuit scale. It is noted that the most significant bit of a register address signal is not used in the read decoding circuits, but is used only at the time when an output data is selected through the judgement of identity with the least significant bit of a window number signal in the output selection circuit. This reduces the number of bits of an input signal into each of the first and second read decoding circuits, thus speeding up decoding.

To simplify the arrangements of the read decoding circuits, there may be used, in addition to a window number, a corrected window number which represents an adjacent window of the window designated by the window number above-mentioned. When the window having a window number 0 shares a double-address register with the window having a window number 1, all bits other than the least significant bit of a window number signal used for specifying the double-address register are common for both windows. This is also applied to other combinations of window numbers such as (2, 3), (4, 5), (6, 7) and the like. However, when the window having a window number 7 shares a double-address register with the window having a window number 0, any bits of a window number signal used for specifying the double-address register are not common for both windows. Also, in a combination of window number such as (1,2), (3,4), (5,6) or the like, the number of common bits is less than that in a combination such as (0,1) or the like. Accordingly, provision is made such that, when the window having a number k (k is an even number) shares a double-address register with the window having a number (k+1), a window number signal is used, and when the window having a number (k−1) shares a double-address register with the window having a number k, a corrected window number signal is used. Bits other than the least significant bit of a window number signal and bits other than the most significant bit of a register address signal are used in the first read decoding circuit in order to assert one of the first read word lines. Bits other than the least significant bit of a corrected window number signal and bits other than the most significant bit of a register address signal are used in the second read decoding circuit in order to assert one of the second read word lines. The adoption of a corrected window number signal simplifies the arrangement of the second read decoding circuit to such an extent as that of the first read decoding circuit. As a result, decoding and subsequently register reading can be speeded up. The least significant bit of a window number signal or a corrected window number signal and the most significant bit of a register address signal are used only at the time when an output data is selected by the output selection circuit.

When the number of windows L is an involution product of 2 ($L=2^M$) and the lower M bits of a value obtained by adding or subtracting 1 to or from a window number are used as a corrected window number, this corrected window number can always indicate an adjacent window. That is, the lower M bits of a value obtained by adding 1 to ($2^M-1$) become 0, and the lower M bits of a value obtained by subtracting 1 from 0, become (L−1). In order that the present invention can also be applied to an arrangement where the number of windows L is a numeral other than an involution product of 2 (where L is less than $2^M$), there may be adopted the following method of determining a corrected window number When there is adopted a corrected window number obtained by adding 1 to a window number, 0 is exceptionally used as a corrected window number for the greatest window number (L−1), and when there is adopted a corrected window No. obtained by subtracting 1 from a window number, (L−1) is exceptionally used as a corrected window number for the smallest window number 0. Accordingly, even though the number of windows L is numeral other than an inavolution product of 2, there can be provided a register file having an overlap-window arrangement which is small in circuit scale and assures high-speed reading.

DETAILED DESCRIPTION OF THE PREFERRED EMBODIMENTS

The following description will successively discuss the respective register files according to five embodiments of the present invention with reference to the attached drawings.

[First Embodiment]

Figure 1:
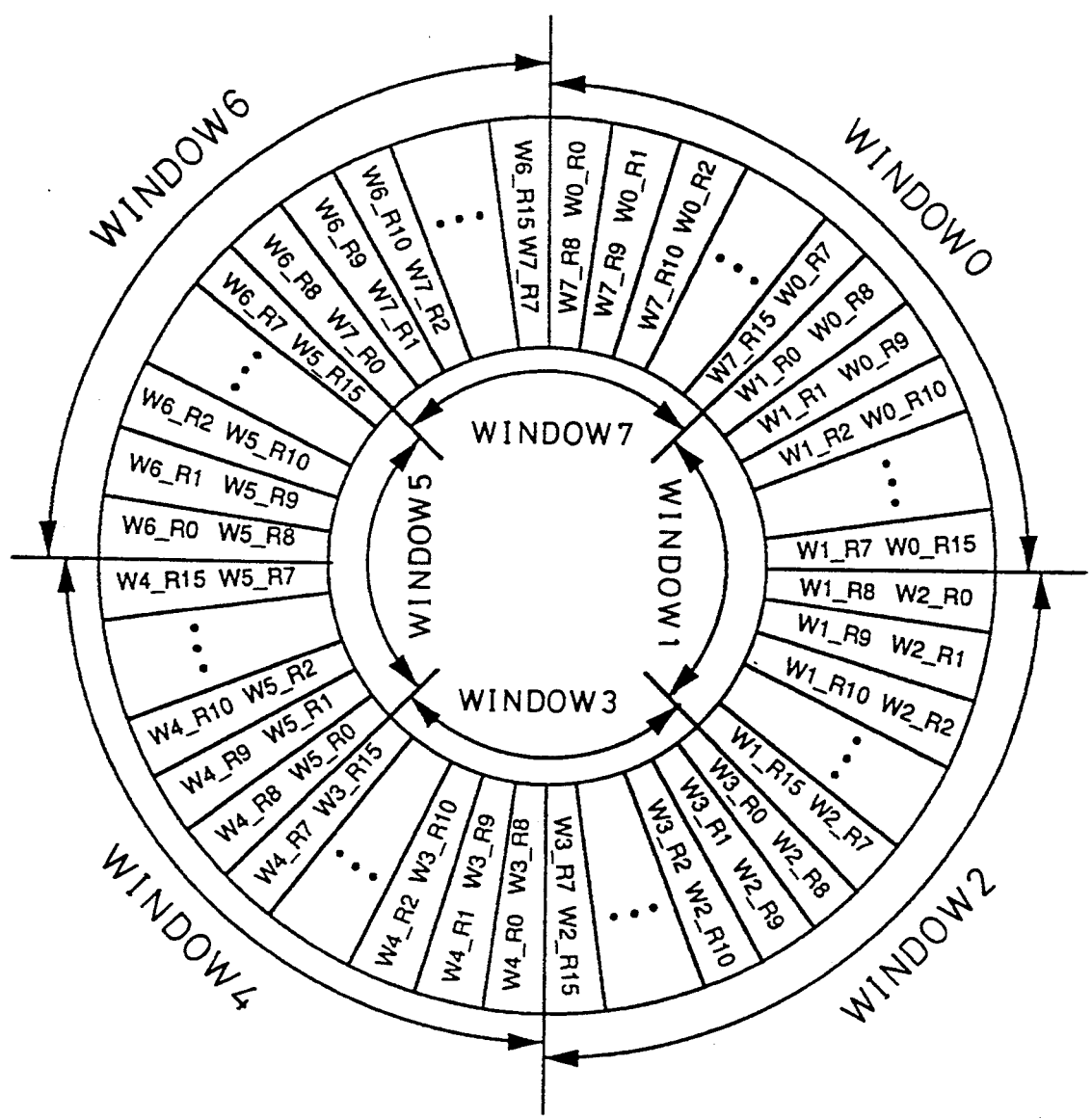
FIG. 1 is a concept view of the arrangement of register windows used in a register file according to each of first to third embodiments of the present invention.

Referring to FIG. 1, 64 registers forming a register file are divided into eight windows W0 to W7 each containing 16 registers R0 to R15. For example, "W0_R2" refers to a register 2 in a window 0. Each window shares eight registers R0 to R7 with the adjacent window having a window No. smaller by 1 than the window No. of said each window, and each window shares the remaining eight registers R8 to R15 with the adjacent window having a window No. greater by 1 than the window No. of said each window. For example, "W0_R0" and "W7_R8" refer to the same register. The windows do not have non-overlapping portions, and all the registers are double-address registers.

Figure 2:
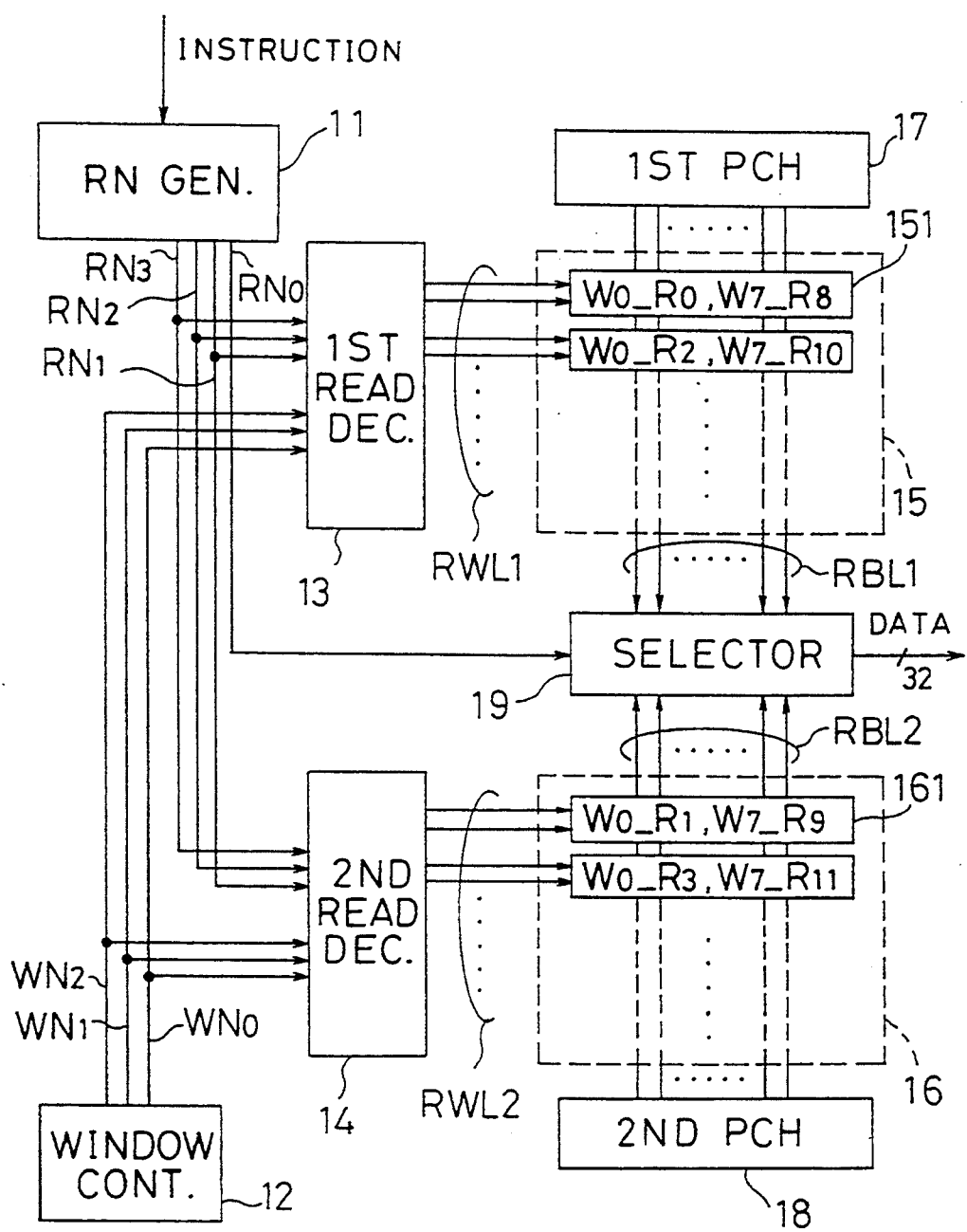
FIG. 2 is a block diagram of the arrangement of reading circuits in the register file according to the first embodiment of the present invention.

In FIG. 2, 64 registers each having a 32-bit length are divided into first and second memory cell arrays 15, 16. The first memory cell array 15 has 32 registers 151 (such as W0_R0, W7_R8 and the like) to be designated by even-numbered register addresses. Each of the 32 registers 151 in the first memory cell array 15 has two first read word lines RWL1, and these 32 registers 151 share 32 first read bit lines RBL1 with one another. The second memory cell array 16 has 32 registers 161 (such as W0_R1, W7_R9 and the like) to be designated by odd-numbered register addresses. Each of the 32 registers 161 in the second memory cell array 16 has two second read word lines RWL2, and these 32 registers 161 share, with one another, 32 second read bit lines RBL2 which are different from the first read bit lines RBL1.

A register address signal generating circuit 11 is adapted to receive an instruction signal, from which a register address (0 to 15) is taken out to generate a 4-bit register address signal RN3 to RN0. A window control circuit 12 is disposed for supplying a 3-bit window No. signal WN2 to WN0 representing the current window No. First and second read decoding circuits 13, 14 are each adapted to receive total 6 bits including all the bits WN2 to WN0 of a window No. signal and a register address signal RN3 to RN1 with the least significant bit thereof excepted, thereby to respectively assert one of the 64 first read word lines RWL1 and one of the 64 second read word lines RWL2.

Tables 1 and 2 show the relationship among a window No. signal WN2 to 0, a register address signal RN3 to 0 and registers selected by the first and second read decoding circuits 13, 14. In Tables, numerals in parentheses are binary numbers, in which x refers to 0 or 1. The functions of the first and second read decoding circuits 13, 14 are achieved by combinational circuits of AND gates and the like.

TABLE 1

| RWL 1 | WN2~0 | RN3~0 | | Register to be Selected | |
|---|---|---|---|---|---|
| 1 | 0 (000) | 0 or 1 | (000x) | W0_R0 | W7_R8 |
| 2 | 7 (111) | 8 or 9 | (100x) | | |
| 3 | 0 (000) | 2 or 3 | (001x) | W0_R2 | W7_R10 |
| 4 | 7 (111) | 10 or 1 | (101x) | | |
| 5 | 0 (000) | 4 or 5 | (010x) | W0_R4 | W7_R12 |
| 6 | 7 (111) | 12 or 13 | (110x) | | |
| 7 | 0 (000) | 6 or 7 | (011x) | W0_R6 | W7_R14 |
| 8 | 7 (111) | 14 or 15 | (111x) | | |
| 9 | 0 (000) | 8 or 9 | (100x) | W0_R8 | W1_R0 |
| 10 | 1 (001) | 0 or 1 | (000x) | | |
| 11 | 0 (000) | 10 or 11 | (101x) | W0_R10 | W1_R2 |
| 12 | 1 (001) | 2 or 3 | (001x) | | |
| 13 | 0 (000) | 12 or 13 | (110x) | W0_R12 | W1_R4 |
| 14 | 1 (001) | 4 or 5 | (010x) | | |
| 15 | 0 (000) | 14 or 15 | (111x) | W0_R14 | W1_R6 |
| 16 | 1 (001) | 6 or 7 | (011x) | | |
| 17 | 2 (010) | 0 or 1 | (000x) | W2_R0 | W1_R8 |
| 18 | 1 (001) | 8 or 9 | (100x) | | |
| 19 | 2 (010) | 2 or 3 | (001x) | W2_R2 | W1_R10 |
| 20 | 1 (001) | 10 or 11 | (101x) | | |
| . | . | . | | . | |
| . | . | . | | . | |
| . | . | . | | . | |
| 61 | 6 (110) | 12 or 13 | (110x) | W6_R12 | W7_R4 |
| 62 | 7 (111) | 4 or 5 | (010x) | | |
| 63 | 6 (110) | 14 or 15 | (111x) | W6_R14 | W7_R6 |
| 64 | 7 (111) | 6 or 7 | (011x) | | |

TABLE 2

| RWL 2 | WN2~0 | RN3~0 | | Register to be Selected | |
|---|---|---|---|---|---|
| 1 | 0 (000) | 0 or 1 | (000x) | W0_R1 | W7_R9 |
| 2 | 7 (111) | 8 or 9 | (100x) | | |
| 3 | 0 (000) | 2 or 3 | (001x) | W0_R3 | W7_R11 |
| 4 | 7 (111) | 10 or 1 | (101x) | | |

TABLE 2-continued

| RWL 2 | WN2~0 | RN3~0 | | Register to be Selected | |
|---|---|---|---|---|---|
| 5 | 0 (000) | 4 or 5 | (010x) | W0_R5 | W7_R13 |
| 6 | 7 (111) | 12 or 13 | (110x) | | |
| 7 | 0 (000) | 6 or 7 | (011x) | W0_R7 | W7_R15 |
| 8 | 7 (111) | 14 or 15 | (111x) | | |
| 9 | 0 (000) | 8 or 9 | (100x) | W0_R9 | W1_R1 |
| 10 | 1 (001) | 0 or 1 | (000x) | | |
| 11 | 0 (000) | 10 or 11 | (101x) | W0_R11 | W1_R3 |
| 12 | 1 (001) | 2 or 3 | (001x) | | |
| 13 | 0 (000) | 12 or 13 | (110x) | W0_R13 | W1_R5 |
| 14 | 1 (001) | 4 or 5 | (010x) | | |
| 15 | 0 (000) | 14 or 15 | (111x) | W0_R15 | W1_R7 |
| 16 | 1 (001) | 6 or 7 | (011x) | | |
| 17 | 2 (010) | 0 or 1 | (000x) | W2_R1 | W1_R9 |
| 18 | 1 (001) | 8 or 9 | (100x) | | |
| 19 | 2 (010) | 2 or 3 | (001x) | W2_R3 | W1_R11 |
| 20 | 1 (001) | 10 or 11 | (101x) | | |
| . | . | . | | . | |
| . | . | . | | . | |
| . | . | . | | . | |
| 61 | 6 (110) | 12 or 13 | (110x) | W6_R13 | W7_R5 |
| 62 | 7 (111) | 4 or 5 | (010x) | | |
| 63 | 6 (110) | 14 or 15 | (111x) | W6_R15 | W7_R7 |
| 64 | 7 (111) | 6 or 7 | (011x) | | |

In FIG. 2, there are also disposed first and second precharging circuits 17, 18 for pre-charging the first and second read bit lines RBL1, RBL2. An output selection circuit (SELECTOR) 19 is adapted to select, as a 32-bit output data, the data on the first read bit lines RBL1 when the least significant bit RN0 of a register address signal is equal to 0, and the data on the second read bit lines RBL2 when the least significant bit RN0 is equal to 1.

Figure 3:
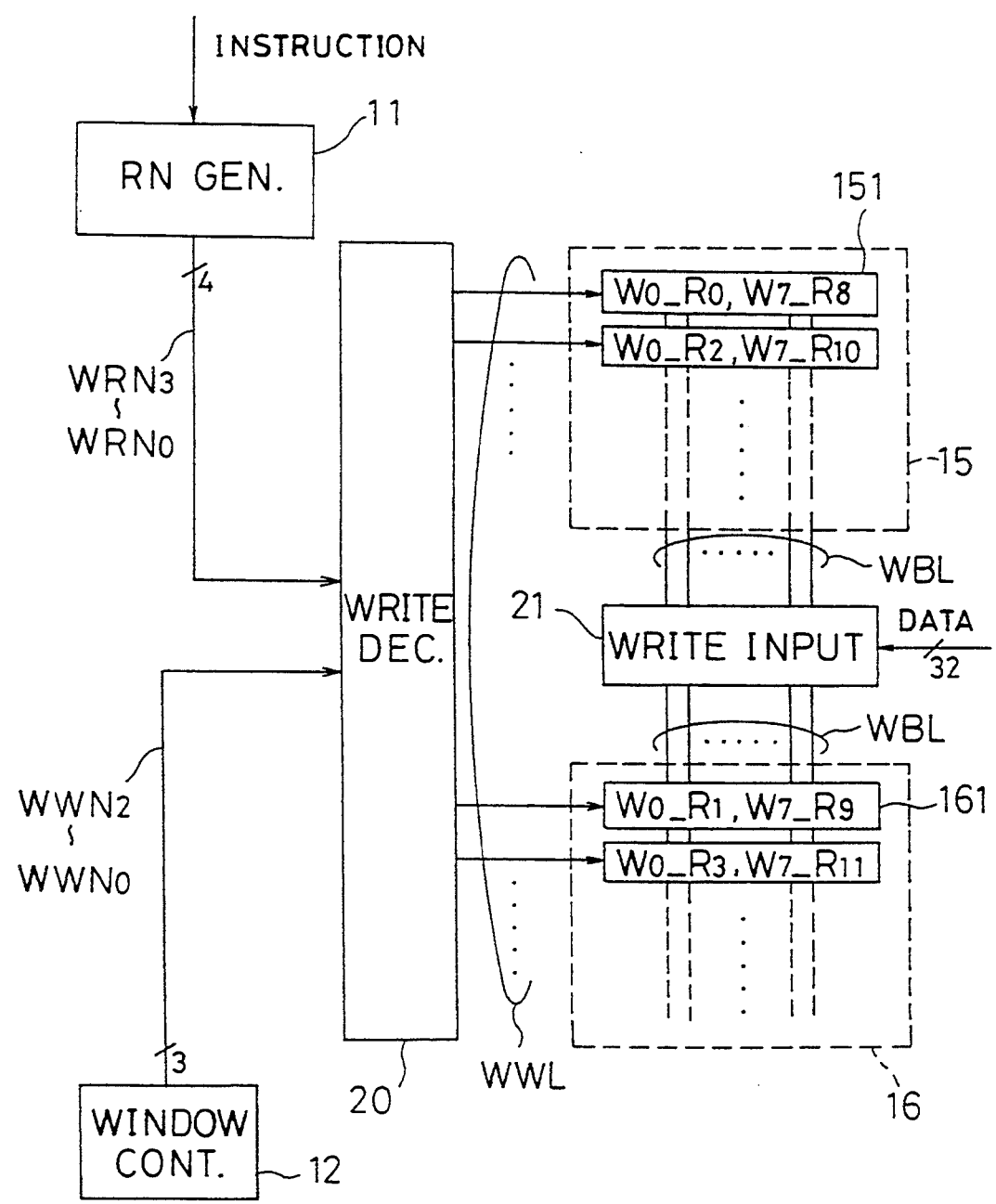
FIG. 3 is a block diagram of the arrangement of writing circuits in the register file according to the first embodiment of the present invention.

In FIG. 3, the register address signal generating circuit 11, the window control circuit 12 and the first and second memory cell arrays 15, 16 are the same component elements shown in FIG. 2. Each of the 64 registers 151, 161 in the first and second memory cell arrays 15, 16 has one write word line WWL, and these 64 registers 151, 161 share 32 write bit lines WBL with one another. A write decoding circuit 20 is adapted to receive total 7 bits including a window No. signal WWN2 to WWN0 from the window control circuit 12 and a register address signal WRN3 to WRN0 from the register address signal generating circuit 11, thus asserting one of the 64 write word lines WWL. A data input circuit (WRITE INPUT) 21 is adapted to supply a 32-bit input data to the write bit lines WBL.

Figure 4:
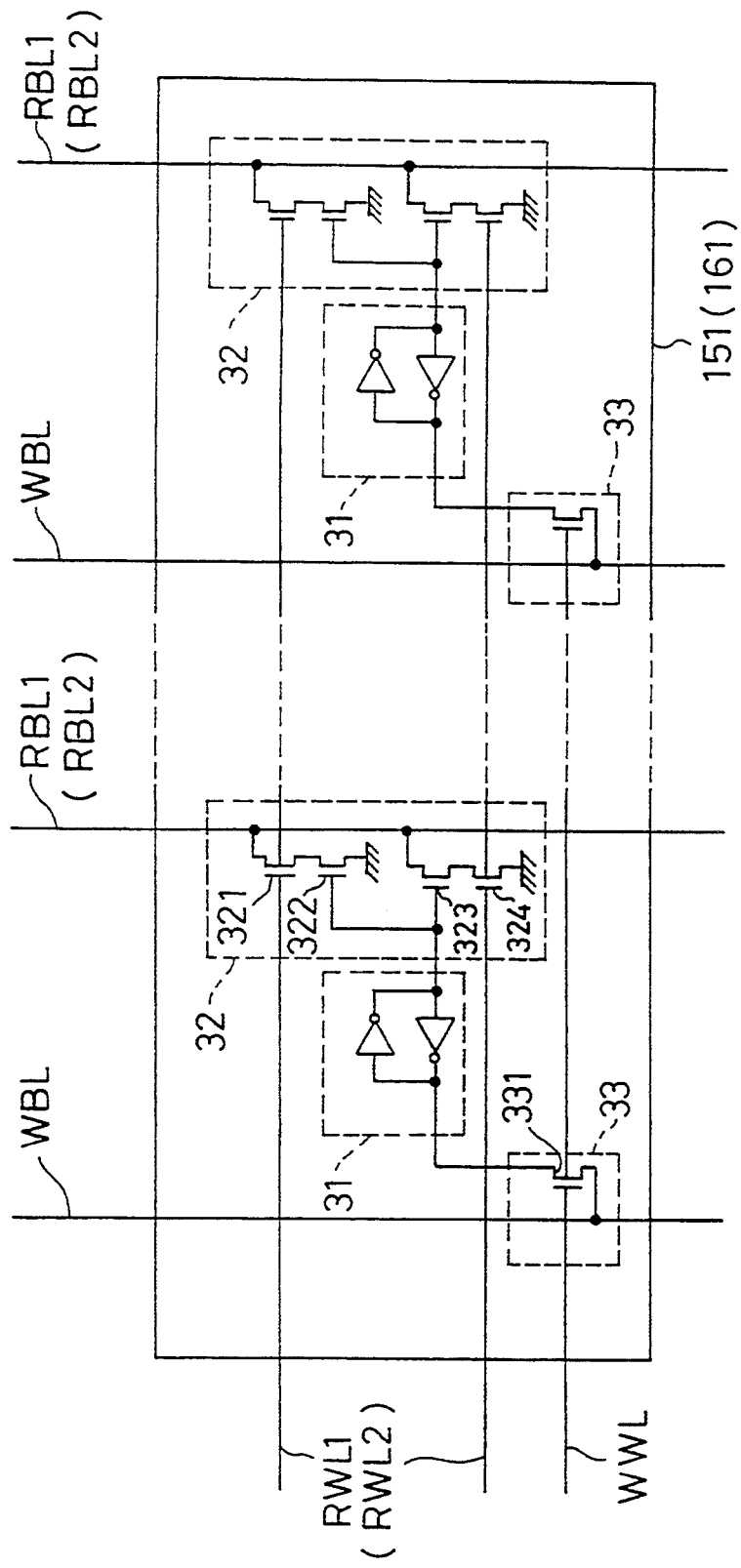
FIG. 4 is a circuit diagram illustrating the inside arrangement of each of registers in FIGS. 2 and 3.

In FIG. 4, one register 151 (161) has 32 memory cells 31 forming one word, and each memory cell has a reading circuit 32 and a writing circuit 33. Each reading circuit 32 has four NchMOS transistors 321 to 324, and each writing circuit 33 has one NchMOS transistor 331. A data on the write bit lines WBL is adapted to be written in the memory cells 31 through the writing circuits 33 when the write word line WWL becomes 1. A data stored in the memory cells 31 is adapted to be supplied to the read bit lines RBL1 (RBL2) through the reading circuits 32 when one of the read word lines RWL1 (RWL2) is equal to 1.

For example, the write word line out of the 64 write word lines WWL connected to the register W1_R2 (W0_R10) can be asserted and become 1, only when the current window No. is 1 and the register address is 2, or when the current window No. is 0 and the register address is 10. An externally given data is then written in the register W1_R2 (W0_R10) thus selected by such an assertion.

A data stored in W1_R2 (W0_R10) will be read in the following manner. When the current window No. is 1 and an instruction signal designates to read a register having a register address 2, data are read not only from W1_R2 (W0_R10) to the first read bit lines RBL1 in the first memory cell array 15, but also from W1_R3 (W0_R11) to the second read bit lines RBL2 in the second memory cell array 16. However, since the least significant bit RN0 of a register address signal is 0, the output selection circuit 19 selects the first read bit lines RBL1 and the data read from W1_R2 (W0_R10), as an output data.

As discussed in the foregoing, the first embodiment is arranged such that the memory cells for double-address registers are divided into the first and second memory cell arrays 15, 16, a window No. signal and a register address signal are respectively decoded directly by the two read decoding circuits 13, 14, one data is read from each of the first and second memory cell arrays 15, 16 and either one of the data thus read is selected by the output selection circuit 19. Accordingly, a register can be read with no intermediary of an address converting circuit for executing an operational processing based on a window No. signal and a register address signal. As a result, a register can be read at high speed. Further, since the memory cells are divided into groups to shorten the read bit lines RBL1, RBL2, the wiring capacitances thereof can be reduced. This further speeds up register reading. Further, the first embodiment is arranged such that the memory cells for double-address registers are divided into first and second memory cell arrays 15, 16 according to the even- and odd-numbered register addresses, and that each register 151 (161) has two read word lines RWL1, RWL2 in view of the fact that each register has double addresses. This reduces the number of bits of each of input signals to the first and second read decoding circuits 13, 14, resulting in high-speed decoding and subsequently high-speed register reading.

According to the first embodiment, however, two read word lines are disposed for each register. Therefore, not only the read decoding circuits 13, 14 but also the reading circuit 32 for each memory cell are inevitably increased in circuit scale. This disadvantageously increases the entire register file in circuit scale. Such problems will be solved by the following embodiments.

(Second Embodiment)

Figure 5:
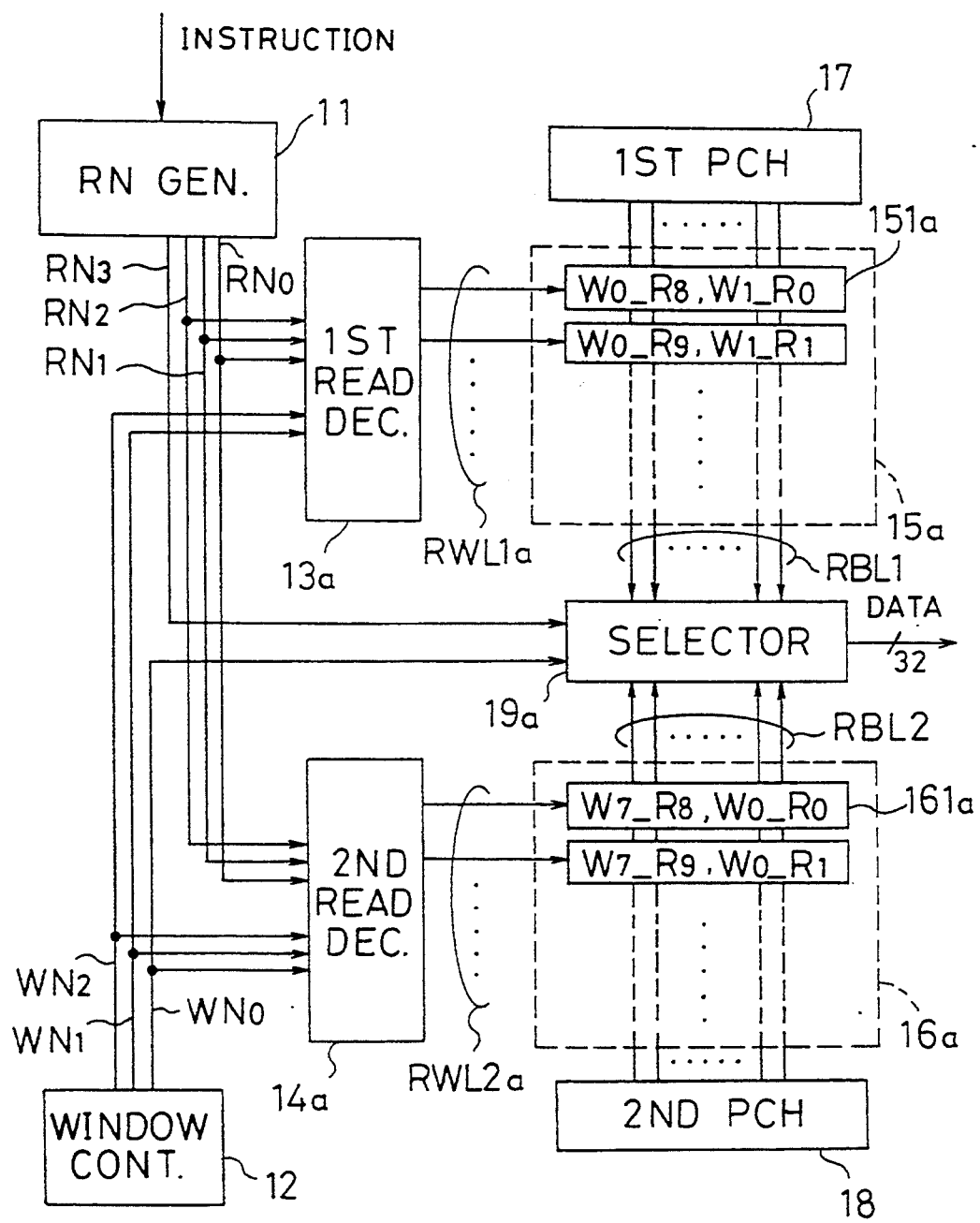
FIG. 5 is a block diagram of the arrangement of reading circuits in the register file according to the second embodiment of the present invention.
Figure 6:
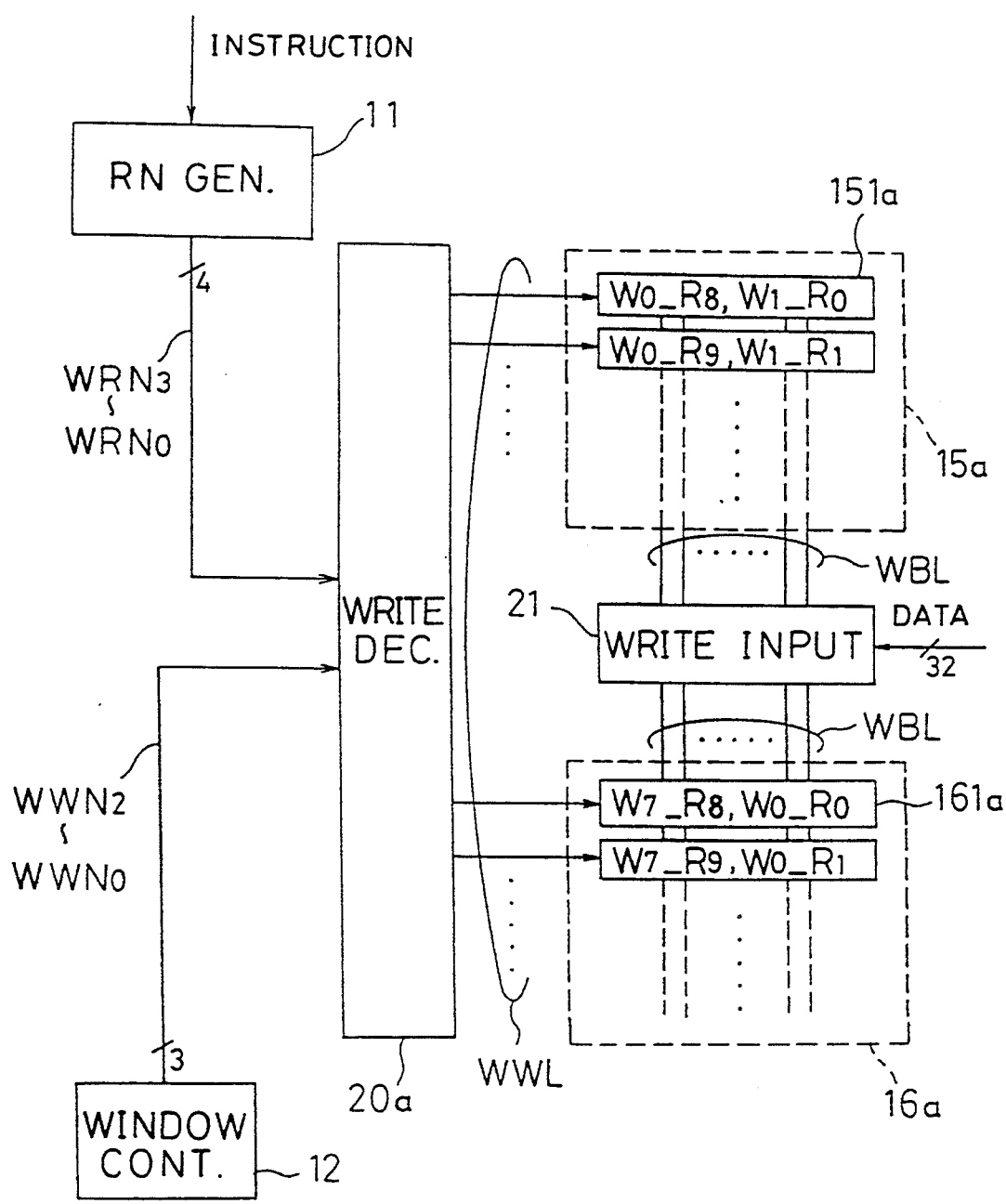
FIG. 6 is a block diagram of the arrangement of writing circuits in the register file according to the second embodiment of the present invention.
Figure 7:
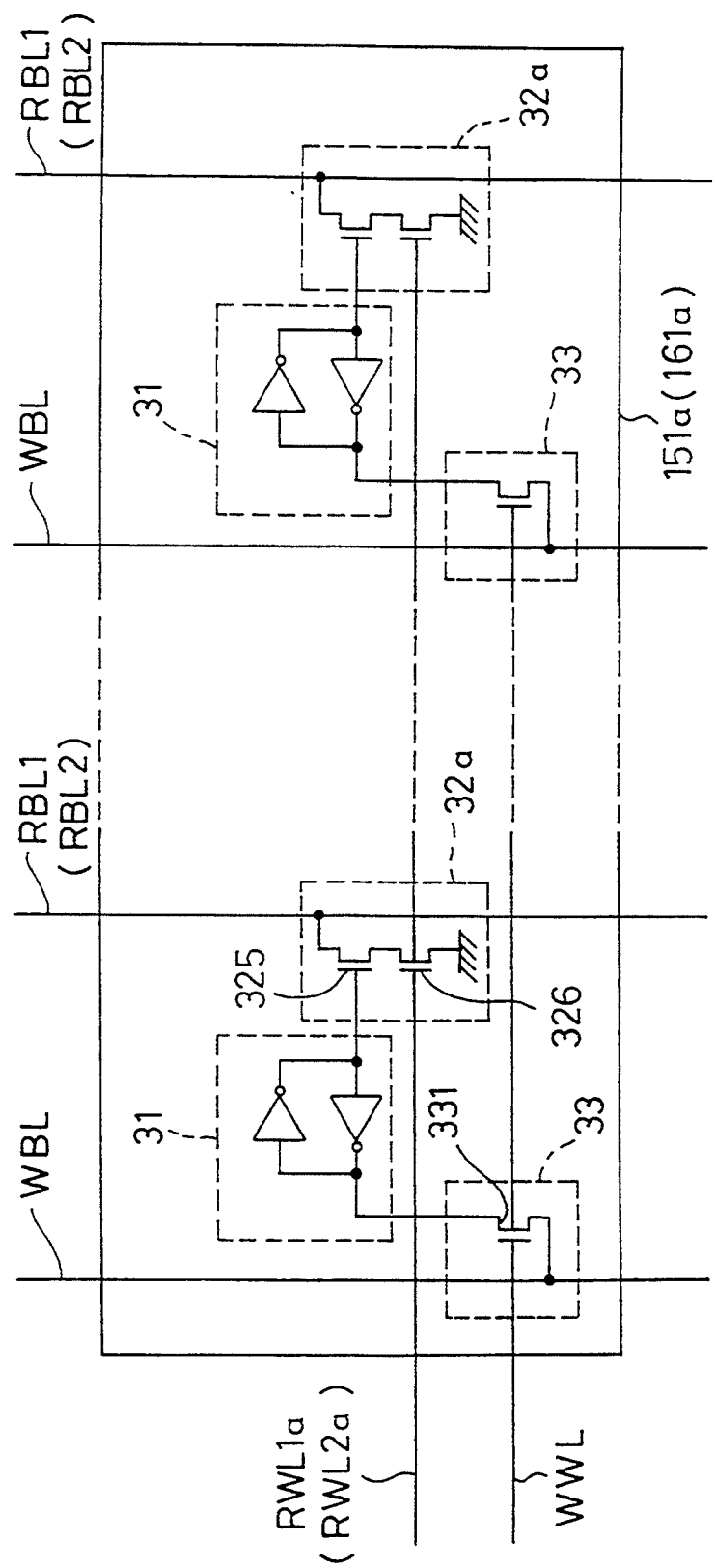
FIG. 7 is a circuit diagram illustrating the inside arrangement of each of registers in FIGS. 5 and 6.

FIGS. 5 to 7 illustrating a second embodiment of the present invention, correspond to FIGS. 2 to 4 illustrating the first embodiment, respectively. In the second embodiment, the arrangement of the register windows is the same as that shown in FIG. 1, and all the registers are double-address registers.

In FIG. 5, a register address signal generating circuit 11, a window control circuit 12 and first and second precharge circuits 17, 18 are circuit blocks having functions similar to those of the corresponding circuit blocks in FIG. 2. In the second embodiment, 64 registers are divided into first and second memory cell arrays 15a, 16a according to the least significant bits of the window Nos. and the most significant bits of the register addresses. More specifically, the first memory cell array 15a contains the latter-half registers R8 to R15 of the even-numbered windows, while the second memory cell array 16a contains the first-half registers R0 to R7 of the even-numbered windows. The latter-half registers R8 to R15 of the even-numbered windows overlap the first-half registers R0 to R7 of the odd-numbered windows, while the first-half registers R0 to R7 of the even-numbered windows overlap the latter-half registers R8 to R15 of the odd-numbered windows. Each of 32 registers 151a (W0_R8, W1_R0 and the like) in the first memory cell array 15a has one first read word line RWL1a, and these 32 registers 151a share 32 first read bit lines RBL1 with one another. Each of 32 registers 161a (W7_R8, W0_R0 and the like) of the second memory cell array 16a has one second read word line RWL2a, and these 32 registers 161a share, with one another, 32 second read bit lines RBL2 which are different from the first read bit lines RBL1.

A first read decoding circuit 13a is adapted to receive total 5 bits including a window No. signal WN2 to WN1 with the least significant bit thereof excepted, and a register address signal RN2 to RN0 with the most significant bit thereof excepted, thereby to assert one of the 32 first read word lines RWL1a. A second read decoding circuit 14a is adapted to receive total 6 bits of all the bits of a window No. signal and a register address signal RN2 to RN0 with the most significant bit thereof excepted.

Tables 3 and 4 show the relationship among a window No. signal WN2 to 0, a register address signal RN3 to 0, and registers selected by the first and second read decoding circuits 13a, 14a.

TABLE 3

| RWL 1a | WN2~0 | | RN3~0 | | Register to be Selected | |
|---|---|---|---|---|---|---|
| 1 | 0 or 1 | (00x) | 0 or 8 | (x000) | W0_R8 | W1_R0 |
| 2 | 0 or 1 | (00x) | 1 or 9 | (x001) | W0_R9 | W1_R1 |
| 3 | 0 or 1 | (00x) | 2 or 10 | (x010) | W0_R10 | W1_R2 |
| 4 | 0 or 1 | (00x) | 3 or 11 | (x011) | W0_R11 | W1_R3 |
| 5 | 0 or 1 | (00x) | 4 or 12 | (x100) | W0_R12 | W1_R4 |
| 6 | 0 or 1 | (00x) | 5 or 13 | (x101) | W0_R13 | W1_R5 |
| 7 | 0 or 1 | (00x) | 6 or 14 | (x110) | W0_R14 | W1_R6 |
| 8 | 0 or 1 | (00x) | 7 or 15 | (x111) | W0_R15 | W1_R7 |
| 9 | 2 or 3 | (01x) | 0 or 8 | (x000) | W2_R8 | W3_R0 |
| 10 | 2 or 3 | (01x) | 1 or 9 | (x001) | W2_R9 | W3_R1 |
| 11 | 2 or 3 | (01x) | 2 or 10 | (x010) | W2_R10 | W3_R2 |
| 12 | 2 or 3 | (01x) | 3 or 11 | (x011) | W2_R11 | W3_R3 |
| 13 | 2 or 3 | (01x) | 4 or 12 | (x100) | W2_R12 | W3_R4 |
| 14 | 2 or 3 | (01x) | 5 or 13 | (x101) | W2_R13 | W3_R5 |
| 15 | 2 or 3 | (01x) | 6 or 14 | (x110) | W2_R14 | W3_R6 |
| 16 | 2 or 3 | (01x) | 7 or 15 | (x111) | W2_R15 | W3_R7 |
| 17 | 4 or 5 | (10x) | 0 or 8 | (x000) | W4_R8 | W5_R0 |
| 18 | 4 or 5 | (10x) | 1 or 9 | (x001) | W4_R9 | W5_R1 |
| 19 | 4 or 5 | (10x) | 2 or 10 | (x010) | W4_R10 | W5_R2 |
| 20 | 4 or 5 | (10x) | 3 or 11 | (x011) | W4_R11 | W5_R3 |
| . | . | | . | | | |
| . | . | | . | | | |
| . | . | | . | | | |
| 29 | 6 or 7 | (11x) | 4 or 12 | (x100) | W6_R12 | W7_R4 |
| 30 | 6 or 7 | (11x) | 5 or 13 | (x101) | W6_R13 | W7_R5 |
| 31 | 6 or 7 | (11x) | 6 or 14 | (x110) | W6_R14 | W7_R6 |
| 32 | 6 or 7 | (11x) | 7 or 15 | (x111) | W6_R15 | W7_R7 |

TABLE 4

| RWL 2a | WN2~0 | | RN3~0 | | Register to be Selected | |
|---|---|---|---|---|---|---|
| 1 | 7(111) or 0(000) | | 0 or 8 | (x000) | W7_R8 | W0_R0 |
| 2 | 7(111) or 0(000) | | 1 or 9 | (x001) | W7_R9 | W0_R1 |
| 3 | 7(111) or 0(000) | | 2 or 10 | (x010) | W7_R10 | W0_R2 |
| 4 | 7(111) or 0(000) | | 3 or 11 | (x011) | W7_R11 | W0_R3 |
| 5 | 7(111) or 0(000) | | 4 or 12 | (x100) | W7_R12 | W0_R4 |
| 6 | 7(111) or 0(000) | | 5 or 13 | (x101) | W7_R13 | W0_R5 |
| 7 | 7(111) or 0(000) | | 6 or 14 | (x110) | W7_R14 | W0_R6 |
| 8 | 7(111) or 0(000) | | 7 or 15 | (x111) | W7_R15 | W0_R7 |
| 9 | 1(001) or 2(010) | | 0 or 8 | (x000) | W1_R8 | W2_R0 |
| 10 | 1(001) or 2(010) | | 1 or 9 | (x001) | W1_R9 | W2_R1 |
| 11 | 1(001) or 2(010) | | 2 or 10 | (x010) | W1_R10 | W2_R2 |
| 12 | 1(001) or 2(010) | | 3 or 11 | (x011) | W1_R11 | W2_R3 |

TABLE 4-continued

| RWL 2a | WN2~0 | RN3~0 | | Register to be Selected | |
|---|---|---|---|---|---|
| 13 | 1(001) or 2(010) | 4 or 12 | (x100) | W1_R$_{12}$ | W2_R$_4$ |
| 14 | 1(001) or 2(010) | 5 or 13 | (x101) | W1_R$_{13}$ | W2_R$_5$ |
| 15 | 1(001) or 2(010) | 6 or 14 | (x110) | W1_R$_{14}$ | W2_R$_6$ |
| 16 | 1(001) or 2(010) | 7 or 15 | (x111) | W1_R$_{15}$ | W2_R$_7$ |
| 17 | 3(011) or 4(100) | 0 or 8 | (x000) | W3_R$_8$ | W4_R$_0$ |
| 18 | 3(011) or 4(100) | 1 or 9 | (x001) | W3_R$_9$ | W4_R$_1$ |
| 19 | 3(011) or 4(100) | 2 or 10 | (x010) | W3_R$_{10}$ | W4_R$_2$ |
| 20 | 3(011) or 4(100) | 3 or 11 | (x011) | W3_R$_{11}$ | W4_R$_3$ |
| . | . | . | | . | |
| . | . | . | | . | |
| . | . | . | | . | |
| 29 | 5(101) or 6(110) | 4 or 12 | (x100) | W5_R$_{12}$ | W6_R$_4$ |
| 30 | 5(101) or 6(110) | 5 or 13 | (x101) | W5_R$_{13}$ | W6_R$_5$ |
| 31 | 5(101) or 6(110) | 6 or 14 | (x110) | W5_R$_{14}$ | W6_R$_6$ |
| 32 | 5(101) or 6(110) | 7 or 15 | (x111) | W5_R$_{15}$ | W6_R$_7$ |

In FIG. 5, an output selection circuit (SELECTOR) 19a is adapted to select, as a 32-bit output data, the data on the first read bit lines RBL1 when the exclusive logical sum of the least significant bit WN0 of a window No. signal and the most significant bit RN3 of a register address signal is equal to 1, and the data on the second read bit lines RBL2 when the exclusive logical sum above-mentioned is equal to 0.

In FIG. 6, the register address signal generating circuit 11, the window control circuit 12 and the first and second memory cell arrays 15a, 16a are the same component elements shown in FIG. 5. Each of the 64 registers 151a, 161a in the first and second memory cell arrays 15a, 16a has one write word line WWL, and these 64 registers 151a, 161a share 32 write bit lines WBL with one another. A write decoding circuit 20a is adapted to receive total 7 bits including a window No. signal WWN2 to WWN0 and a register address signal WRN3 to WRN0, thereby to assert one of the 64 write word lines WWL. A data input circuit (WRITE INPUT) 21 is adapted to supply a 32-bit input data to the write bit lines WBL.

In FIG. 7, one register 151a (161a) has 32 memory cells 31 forming one word, and each memory cell has a reading circuit 32a and a writing circuit 33. Each reading circuit 32a has two NchMOS transistors 325, 326, and each writing circuit 33 has one NchMOS transistor 331. A data on the write bit lines WBL is adapted to be written in the memory cells 31 through the writing circuits 33 when the write word line WWL becomes 1. A data stored in the memory cells 31 is adapted to be supplied to the read bit lines RBL1 (RBL2) through the reading circuits 32 when the read word line RWL1a (RWL2a) becomes 1.

For example, the write word line out of the 64 write word lines WWL connected to W1_R2 (W0_R10) can be asserted and become 1, only when the current window No. is 1 and the register address is 2, or when the current window No. is 0 and the register address is 10. An externally given data is written in W1_R2 (W0_R10) which has been selected by such an assertion.

A data stored in W1_R2 (W0_R10) will be read in the following manner. When the current window No. is 1 and an instruction signal designates to read the register having a register address 2, data are read not only from W1_R2 (W0_R10) to the first read bit lines RBL1 in the first memory cell array 15a, but also from W1_R10 (W2_R2) to the second read bit lines RBL2 in the second memory cell array 16a. However, since the exclusive logical sum of the least significant bit WN0 of a window No. signal and the most significant bit RN3 of a register address signal is equal to 1, the output selection circuit 19a selects the first read bit lines RBL1 and the data read from W1_R2 (W0_R10), as an output data.

As discussed in the foregoing, the second embodiment is arranged such that the memory cells for double-address registers are divided into the first and second memory cell arrays 15a, 16a such that those double-address registers in each window which also belong to one adjacent window, are separated from those double-address registers in said each window which also belong to the other adjacent window. Further, the second embodiment is arranged such that one read word line RWL1a (RWL2a) is disposed for each register 151a (161a). Accordingly, the first and second read decoding circuits 13a, 14a are reduced in circuit scale as compared with those in the first embodiment. This simplifies the arrangement of each reading circuit 32a for each memory cell. As a result, the entire register file can be reduced in circuit scale.

According to the second embodiment, the first read decoding circuit 13a is adapted to receive two bits of a window No. signal WN2 to WN0 except for the least significant bit thereof, while the second read decoding circuit 14a is adapted to receive all the bits of a window No. signal WN2 to WN0. In the following third embodiment, two read decoding circuits are equalized to each other by correcting a window No.

(Third Embodiment)

Figure 8:
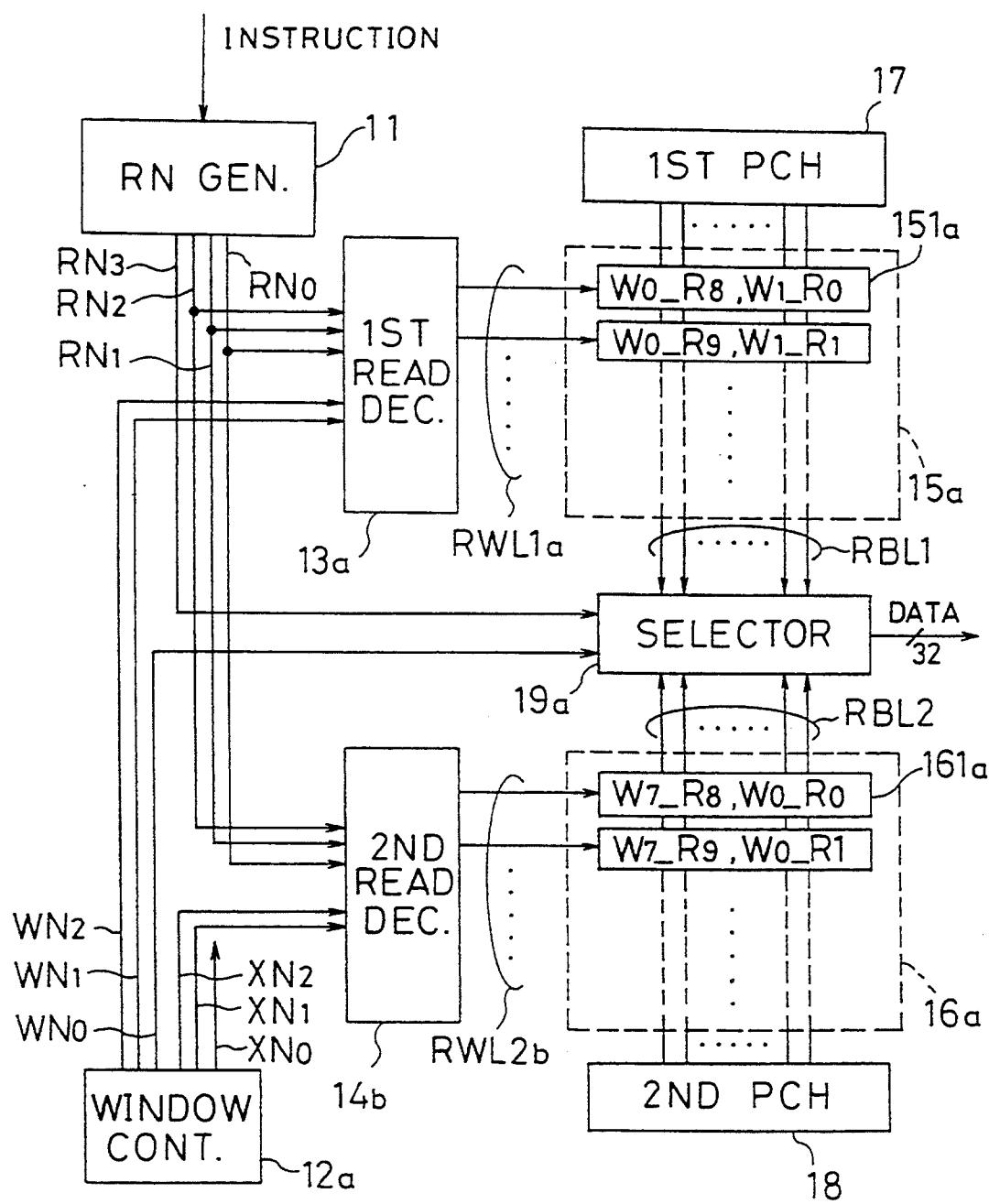
FIG. 8 is a block diagram of the arrangement of reading circuits in the register file according to the third embodiment of the present invention.

FIG. 8 illustrating a third embodiment of the present invention, corresponds to FIG. 5 illustrating the second embodiment. In the third embodiment, the arrangement of the register windows is the same as that shown in FIG. 1, and all the registers are double-address registers.

In FIG. 8, a register address signal generating circuit 11, a first read decoding circuit 13a, first and second memory cell arrays 15a, 16a, first and second precharge circuits 17, 18 and an output selection circuit 19a are circuit blocks similar to those shown in FIG. 5. In the third embodiment, a window control circuit 12a has not only a function of supplying a 3-bit window No. signal WN2 to WN0 representing the current window No. (0 to 7), but also a function of supplying the lower three bits of a value obtained by adding 1 to the current window No., as a corrected window No. signal XN2 to XN0. A second read decoding circuit 14b is adapted to receive total 5 bits including a corrected window No. signal XN2 to XN1 with the least significant bit thereof excepted, and a register address signal RN2 to RN0 with the most significant bit thereof excepted, thereby to assert one of 32 second read word lines RWL2b for the second memory cell array 16a. That is, each of the input signals of the first and second read decoding circuits 13a, 14b has five bits.

Table 5 shows the relationship among a corrected window No. signal XN2 to 0, a register address signal RN3 to 0, and a register to be selected by the second read decoding circuit 14b. It is noted that the decoding method of the first read decoding circuit 13a is as set shown in Table 3.

TABLE 5

| RWL 2b | XN2~0 | RN3~0 | | Register to be Selected | |
|---|---|---|---|---|---|
| 1 | 0 or 1 (00x) | 0 or 8 | (x000) | W7_R$_8$ | W0_R$_0$ |

TABLE 5-continued

| RWL 2b | XN2~0 | RN3~0 | | Register to be Selected | |
|---|---|---|---|---|---|
| 2 | 0 or 1 (00x) | 1 or 9 | (x001) | $W7\_R_9$ | $W0\_R_1$ |
| 3 | 0 or 1 (00x) | 2 or 10 | (x010) | $W7\_R_{10}$ | $W0\_R_2$ |
| 4 | 0 or 1 (00x) | 3 or 11 | (x011) | $W7\_R_{11}$ | $W0\_R_3$ |
| 5 | 0 or 1 (00x) | 4 or 12 | (x100) | $W7\_R_{12}$ | $W0\_R_4$ |
| 6 | 0 or 1 (00x) | 5 or 13 | (x101) | $W7\_R_{13}$ | $W0\_R_5$ |
| 7 | 0 or 1 (00x) | 6 or 14 | (x110) | $W7\_R_{14}$ | $W0\_R_6$ |
| 8 | 0 or 1 (00x) | 7 or 15 | (x111) | $W7\_R_{15}$ | $W0\_R_7$ |
| 9 | 2 or 3 (01x) | 0 or 8 | (x000) | $W1\_R_8$ | $W2\_R_0$ |
| 10 | 2 or 3 (01x) | 1 or 9 | (x001) | $W1\_R_9$ | $W2\_R_1$ |
| 11 | 2 or 3 (01x) | 2 or 10 | (x010) | $W1\_R_{10}$ | $W2\_R_2$ |
| 12 | 2 or 3 (01x) | 3 or 11 | (x011) | $W1\_R_{11}$ | $W2\_R_3$ |
| 13 | 2 or 3 (01x) | 4 or 12 | (x100) | $W1\_R_{12}$ | $W2\_R_4$ |
| 14 | 2 or 3 (01x) | 5 or 13 | (x101) | $W1\_R_{13}$ | $W2\_R_5$ |
| 15 | 2 or 3 (01x) | 6 or 14 | (x110) | $W1\_R_{14}$ | $W2\_R_6$ |
| 16 | 2 or 3 (01x) | 7 or 15 | (x111) | $W1\_R_{15}$ | $W2\_R_7$ |
| 17 | 4 or 5 (10x) | 0 or 8 | (x000) | $W3\_R_8$ | $W4\_R_0$ |
| 18 | 4 or 5 (10x) | 1 or 9 | (x001) | $W3\_R_9$ | $W4\_R_1$ |
| 19 | 4 or 5 (10x) | 2 or 10 | (x010) | $W3\_R_{10}$ | $W4\_R_2$ |
| 20 | 4 or 5 (10x) | 3 or 11 | (x011) | $W3\_R_{11}$ | $W4\_R_3$ |
| . | . | . | . | . | . |
| . | . | . | . | . | . |
| . | . | . | . | . | . |
| 29 | 6 or 7 (11x) | 4 or 12 | (x100) | $W5\_R_{12}$ | $W6\_R_4$ |
| 30 | 6 or 7 (11x) | 5 or 13 | (x101) | $W5\_R_{13}$ | $W6\_R_5$ |
| 31 | 6 or 7 (11x) | 6 or 14 | (x110) | $W5\_R_{14}$ | $W6\_R_6$ |
| 32 | 6 or 7 (11x) | 7 or 15 | (x111) | $W5\_R_{15}$ | $W6\_R_7$ |

For example, a data stored in $W2\_R3$ ($W1\_R11$) will be read in the following manner. When the current window No. is 2 (the corrected window No. is 3) and an instruction signal designates to read the register having a register address 3, data are read not only from $W2\_R3$ ($W1\_R11$) to the second read bit lines RBL2 in the second memory cell array 16a, but also from $W3\_R3$ ($W2\_R11$) to the first read bit lines RBL1 in the first memory cell array 15a. However, since the exclusive logical sum of the least significant bit WN0 of a window No. signal and the most significant bit RN3 of a register address signal is equal to 0, the output selection circuit 19a selects the second read bit lines RBL2 and the data read from $W2\_R3$ ($W1\_R11$), as an output data.

According to the third embodiment, the four combinations of window Nos. of (7,0), (1,2), (3,4), (5,6) (See Table 4) in the second embodiment, are converted into the combinations of corrected window Nos. of (0,1), (2,3), (4,5), (6,7) (See Table 5). Accordingly, the arrangement of the second read decoding circuit 14b is simplified to an extent similar to that of the first read decoding circuit 13a. As a result, decoding and subsequently reading a register can be speeded up.

Alternatively, the lower three bits of a value obtained by subtracting 1 from the current window No. may be used as a corrected window No. signal XN2 to XN0. In this case, the four combinations of window Nos. of (7,0), (1,2), (3,4), (5,6) in the second embodiment, are converted into the combinations of corrected window Nos. of (6,7), (0,1), (2,3), (4,5). Accordingly, there can be adopted a simple decoding method as shown in Table 5 for the second read decoding circuit.

When a corrected window No. signal is used as in the third embodiment, the output selection circuit 19a may be so arranged as to select an output data according to the exclusive logical sum of the least significant bit XN0 of a corrected window No. signal and the most significant bit RN3 of a register address signal. However, when the exclusive logical sum above-mentioned is equal to 1, a data on the second read bit lines RBL2 is selected as an output data, and when the exclusive logical sum above-mentioned is equal to 0, a data on the first read bit lines RBL1 is selected as an output data.

(Fourth Embodiment)

Figure 9:
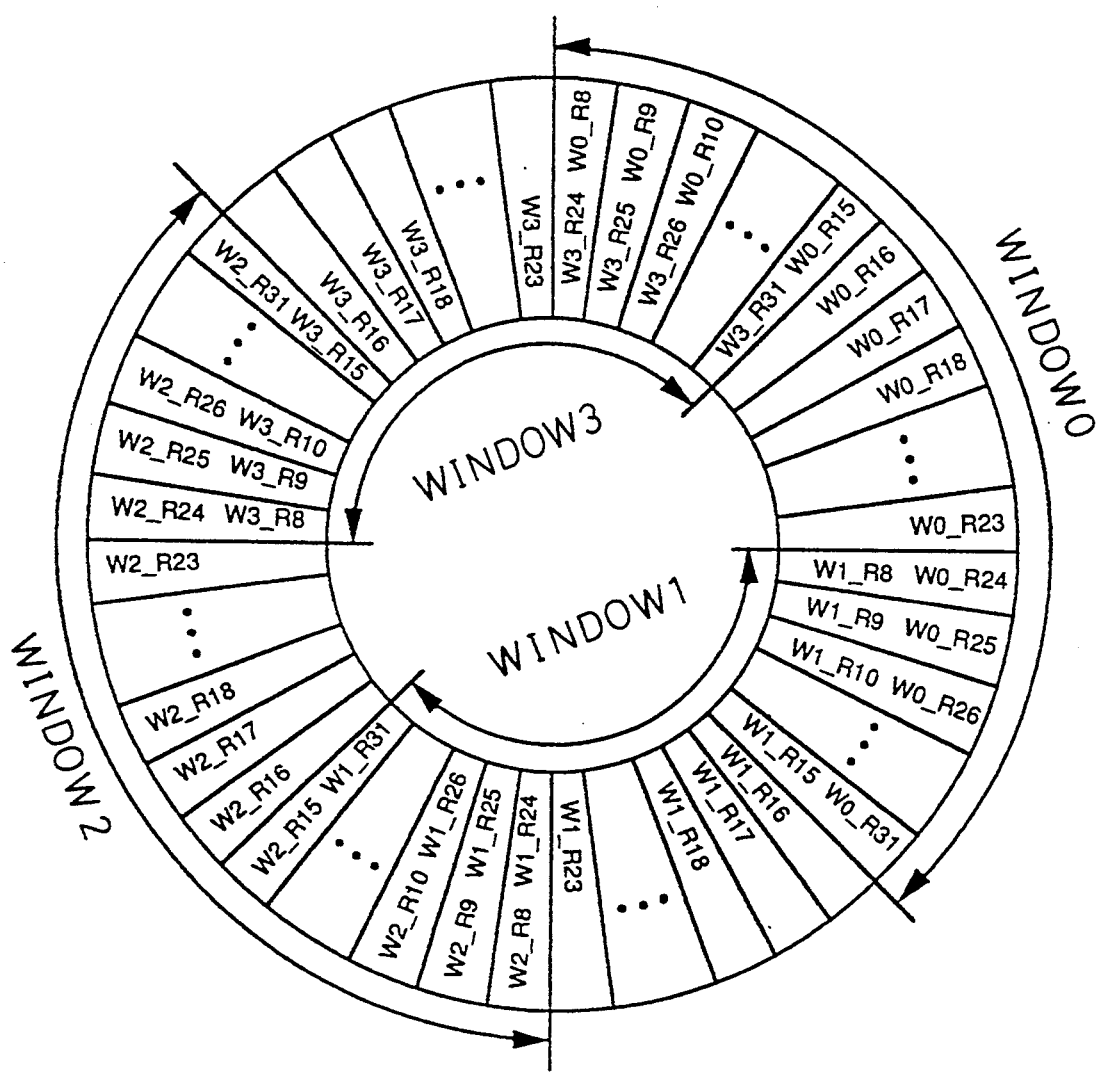
FIG. 9 is a concept view of the arrangement of register windows used in a register file according to a fourth embodiment of the present invention.

According to a fourth embodiment, eight registers R0 to R7 out of 72 registers forming a register file are global registers which do not belong to any windows. In FIG. 9, the remaining 64 registers are divided into four windows W0 to W3 each containing 24 registers R8 to R31. Each window shares eight registers R8 to R15 with the adjacent window having a window No. smaller by 1 than the window No. of said each window, and each window shares eight registers R24 to R31 with the adjacent window having a window No. greater by 1 than the window No. of said each window. The remaining eight registers R16 to R23 are inherent in each window and are not overlappingly contained in other window. That is, double-address registers are only 16 registers R8 to R15 and R24 to R31 in each window.

Figure 10:
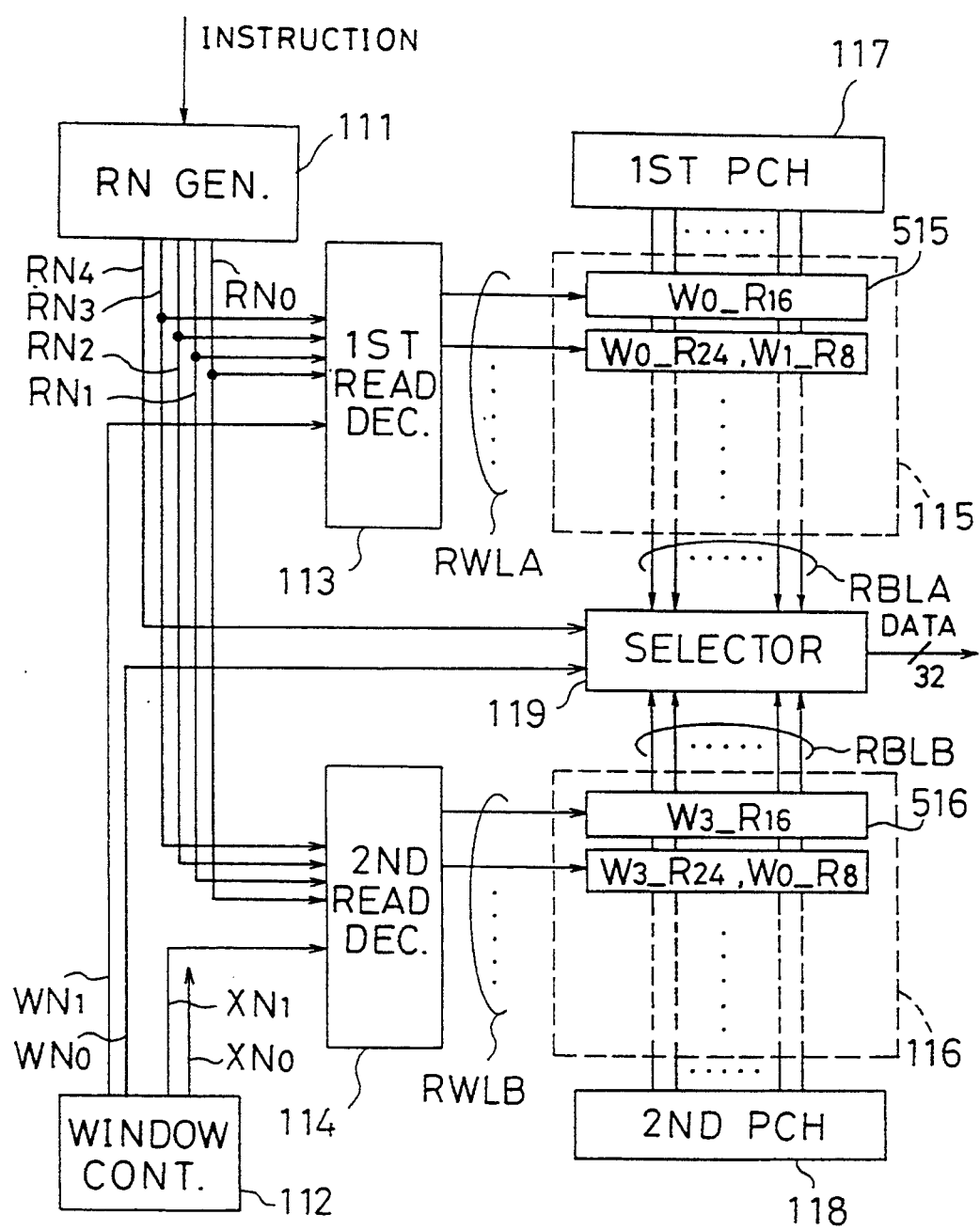
FIG. 10 is a block diagram of the arrangement of reading circuits in the register file according to the fourth embodiment of the present invention.

In FIG. 10, 64 registers belonging to any window are divided into first and second memory cell arrays 115, 116 according to the least significant bits of window Nos. and the most significant bits of register addresses. More specifically, the first memory cell array 115 contains the latter-half registers R16 to R31 of even-numbered windows, and the second memory cell array 116 contains the latter-half registers R16 to R31 of odd-numbered windows. A half of the latter-half registers R16 to R31 of the even-numbered windows overlaps the eight first-half registers R8 to R15 of the odd-numbered windows, while a half of the latter-half registers R16 to R31 of the odd-numbered windows overlaps the eight first-half registers R8 to R15 of the even-numbered windows.

Each of 32 registers 515 ($W0\_R24$, $W1\_R8$ and the like) in the first memory cell array 115 has one first read word line RWLA, and these 32 registers 515 share 32 first read bit lines RBLA with one another. Each of 32 registers 516 ($W3\_R24$, $W0\_R8$ and the like) in the second memory cell array 116 has one second read word line RWLB, and these 32 registers 516 share, with one another, 32 second read bit lines RBLB which are different from the first read bit lines RBLA.

A register address signal generating circuit 111 is adapted to receive an instruction signal, from which a register address (8 to 31) is taken out to generate a 5-bit register address signal RN4 to RN0. A window control circuit 112 is adapted to supply a 2-bit window No. signal WN1 to WN0 representing the current window No. (0 to 3), and a 2-bit corrected window No. signal XN1 to XN0 obtained by adding 1 to the current window No. A first read decoding circuit 113 is adapted to receive total 5 bits including a window No. signal WN1 with the least significant bit thereof excepted, and a register address signal RN3 to RN0 with the most significant bit thereof excepted, thereby to assert one of the 32 first read word lines RWLA. A second read decoding circuit 114 is adapted to receive total 5 bits including a corrected window No. signal XN1 with the least significant bit thereof excepted, and a register address signal RN3 to RN0 with the most significant bit thereof excepted, thereby to assert one of the 32 second read word lines RWLB.

Tables 6, 7 show the decoding methods of the first and second read decoding circuits 113, 114.

TABLE 6

| RWLA | WN1~0 | RN4~0 | | Register to be Selected | |
|---|---|---|---|---|---|
| 1 | 0 or 1 (0x) | 16 | (x0000) | W0_R16 | |
| 2 | 0 or 1 (0x) | 17 | (x0001) | W0_R17 | |
| 3 | 0 or 1 (0x) | 18 | (x0010) | W0_R18 | |
| 4 | 0 or 1 (0x) | 19 | (x0011) | W0_R19 | |
| 5 | 0 or 1 (0x) | 20 | (x0100) | W0_R20 | |
| 6 | 0 or 1 (0x) | 21 | (x0101) | W0_R21 | |
| 7 | 0 or 1 (0x) | 22 | (x0110) | W0_R22 | |
| 8 | 0 or 1 (0x) | 23 | (x0111) | W0_R23 | |
| 9 | 2 or 3 (1x) | 16 | (x0000) | W2_R16 | |
| 10 | 2 or 3 (1x) | 17 | (x0001) | W2_R17 | |
| . | . | . | . | . | |
| 16 | 2 or 3 (1x) | 23 | (x0111) | W2_R23 | |
| 17 | 0 or 1 (0x) | 8 or 24 | (x1000) | W0_R24 | W1_R8 |
| 18 | 0 or 1 (0x) | 9 or 25 | (x1001) | W0_R25 | W1_R9 |
| 19 | 0 or 1 (0x) | 10 or 26 | (x1010) | W0_R26 | W1_R10 |
| 20 | 0 or 1 (0x) | 11 or 27 | (x1011) | W0_R27 | W1_R11 |
| 21 | 0 or 1 (0x) | 12 or 28 | (x1100) | W0_R28 | W1_R12 |
| 22 | 0 or 1 (0x) | 13 or 29 | (x1101) | W0_R29 | W1_R13 |
| 23 | 0 or 1 (0x) | 14 or 30 | (x1110) | W0_R30 | W1_R14 |
| 24 | 0 or 1 (0x) | 15 or 31 | (x1111) | W0_R31 | W1_R15 |
| 25 | 2 or 3 (1x) | 8 or 24 | (x1000) | W2_R24 | W3_R8 |
| 26 | 2 or 3 (1x) | 9 or 25 | (x1001) | W2_R25 | W3_R9 |
| . | . | . | . | . | . |
| 32 | 2 or 3 (1x) | 15 or 31 | (x1111) | W2_R31 | W3_R15 |

TABLE 7

| RWLB | XN1~0 | RN4~0 | | Register to be Selected | |
|---|---|---|---|---|---|
| 1 | 0 or 1 (0x) | 16 | (x0000) | W3_R16 | |
| 2 | 0 or 1 (0x) | 17 | (x0001) | W3_R17 | |
| 3 | 0 or 1 (0x) | 18 | (x0010) | W3_R18 | |
| 4 | 0 or 1 (0x) | 19 | (x0011) | W3_R19 | |
| 5 | 0 or 1 (0x) | 20 | (x0100) | W3_R20 | |
| 6 | 0 or 1 (0x) | 21 | (x0101) | W3_R21 | |
| 7 | 0 or 1 (0x) | 22 | (x0110) | W3_R22 | |
| 8 | 0 or 1 (0x) | 23 | (x0111) | W3_R23 | |
| 9 | 2 or 3 (1x) | 16 | (x0000) | W1_R16 | |
| 10 | 2 or 3 (1x) | 17 | (x0001) | W1_R17 | |
| . | . | . | . | . | |
| 16 | 2 or 3 (1x) | 23 | (x0111) | W1_R23 | |
| 17 | 0 or 1 (0x) | 8 or 24 | (x1000) | W3_R24 | W0_R8 |
| 18 | 0 or 1 (0x) | 9 or 25 | (x1001) | W3_R25 | W0_R9 |
| 19 | 0 or 1 (0x) | 10 or 26 | (x1010) | W3_R26 | W0_R10 |
| 20 | 0 or 1 (0x) | 11 or 27 | (x1011) | W3_R27 | W0_R11 |
| 21 | 0 or 1 (0x) | 12 or 28 | (x1100) | W3_R28 | W0_R12 |
| 22 | 0 or 1 (0x) | 13 or 29 | (x1101) | W3_R29 | W0_R13 |
| 23 | 0 or 1 (0x) | 14 or 30 | (x1110) | W3_R30 | W0_R14 |
| 24 | 0 or 1 (0x) | 15 or 31 | (x1111) | W3_R31 | W0_R15 |
| 25 | 2 or 3 (1x) | 8 or 24 | (x1000) | W1_R24 | W2_R8 |
| 26 | 2 or 3 (1x) | 9 or 25 | (x1001) | W1_R25 | W2_R9 |
| . | . | . | . | . | . |
| 32 | 2 or 3 (1x) | 15 or 31 | (x1111) | W1_R31 | W2_R15 |

In FIG. 10, there are also disposed first and second precharging circuits 117, 118 for pre-charging the first and second read bit lines RBLA, RBLB. An output selection circuit (SELECTOR) 119 is adapted to select, as an output data, a data on the first read bit lines RBLA when the exclusive logical sum of the least significant bit WN0 of a window No. signal and the most significant bit RN4 of a register address signal is equal to 1, and a data on the second read bit lines RBLB when the exclusive logical sum above-mentioned is equal to 0.

For example, a data stored in W2_R10 (W1_R26) will be read in the following manner. When the current window No. is 2 (the corrected window No. is 3) and an instruction signal designates to read the register having a register address 10, data are read not only from W2_R10 (W1_R26) to the second read bit lines RBLB in the second memory cell array 116, but also from W3_R10 (W2_R26) to the first read bit lines RBLA in the first memory cell array 115. However, since the exclusive logical sum of the least significant bit WN0 of a window No. signal and the most significant bit RN4 of a register address signal is equal to 0, the output selection circuit 119 selects the second read bit lines RBLB and the data read from W2_R10 (W1_R26), as an output data.

When the current window No. is 2 (the corrected window No. is 3) and an instruction signal designates to read the register having a register address 18, data are read not only from W2_R18 in the first memory cell array 115, but also from W1_R18 in the second memory cell array 116. However, since the exclusive logical sum of the least significant bit WN0 of a window No. signal and the most significant bit RN4 of a register address signal is equal to 1, the data read from W2_R18 is selected as an output data by the output selection circuit 119.

As discussed in the foregoing, the fourth embodiment provides a register file having a window arrangement including non-overlapping portions, which assures high-speed register reading and which is reduced in circuit scale. Likewise in the third embodiment, the lower two bits of a value obtained by subtracting 1 from the current window No. may be used as a corrected window No. signal XN1 to XN0. Also, provision may be made such that the output selection circuit 119 selects an output data according to the exclusive logical sum of the least significant bit XN0 of a corrected window No. signal and the most significant bit RN4 of a register address signal. However, when the exclusive logical sum above-mentioned is equal to 1, a data on the second read bit lines RBLB is selected as an output data, and when the exclusive logical sum above-mentioned is equal to 0, a data on the first read bit lines RBLA is selected as an output data.

The fourth embodiment can be applied to a register file having no global registers. In such an application, the register addresses are shifted by 8 addresses in the following manner. Total 64 registers are divided into four windows W0 to W3 each containing 24 registers R0 to R23. Each window shares eight registers R0 to R7 with the adjacent window having a window No. smaller by 1 than the window No. of said each window, and each window shares eight registers R16 to R23 with the adjacent window having a window No. greater by 1 than the window No. of said each window. Registers inherent in each window are registers R8 to R15. In this case, too, the registers can be read at high speed according to a decoding method similar to that shown in Tables 6, 7.

(Fifth Embodiment)

Figure 11:
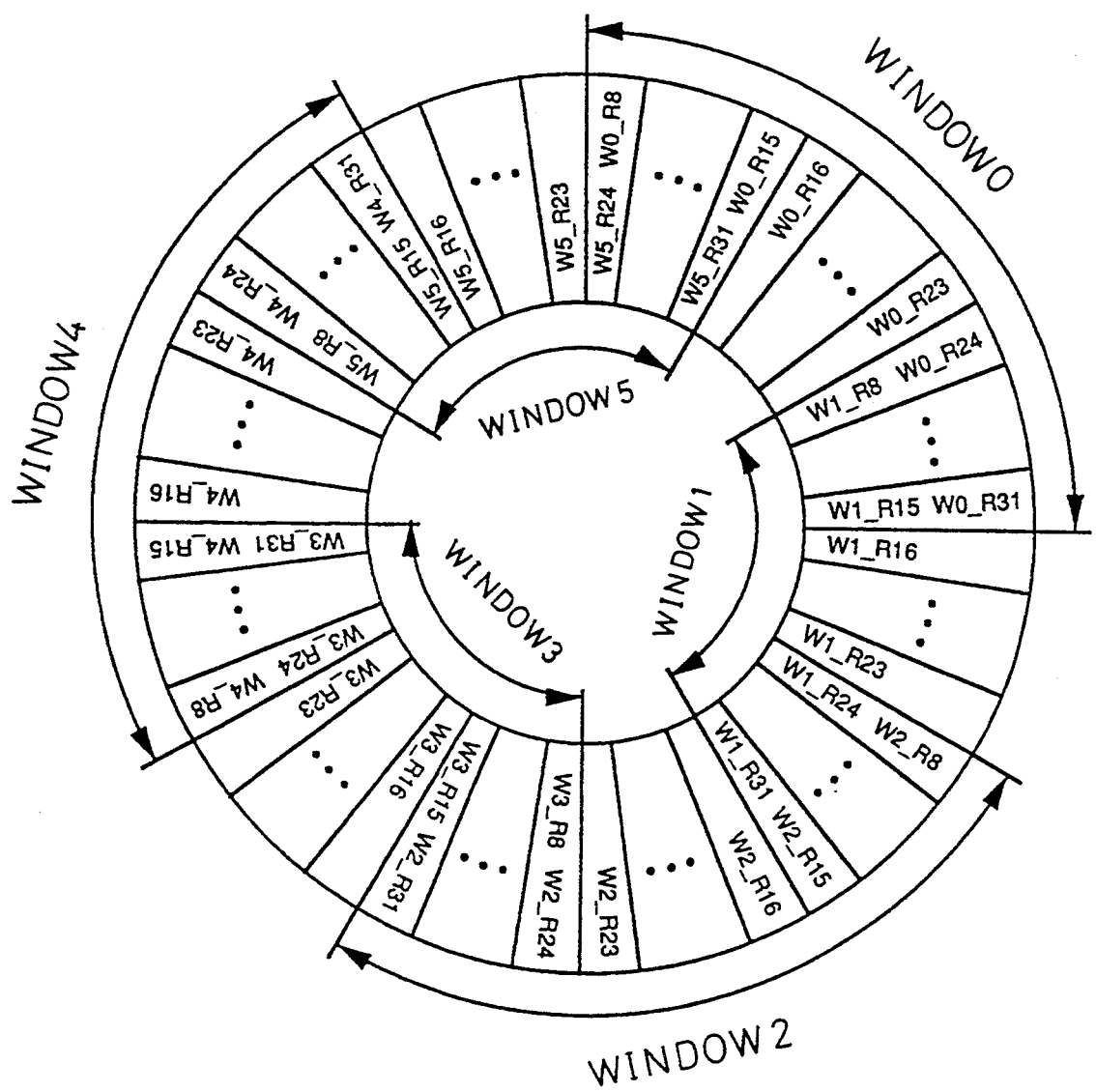
FIG. 11 is a concept view of the arrangement of register windows used in a register file according to a fifth embodiment of the present invention.

In FIG. 11, eight registers R0 to R7 out of 104 registers forming a register file are global registers (not shown) which do not belong to any windows, and the remaining 96 registers are divided into six windows W0 to W5 each containing 24 registers R8 to R31. Each window shares eight registers R8 to R15 with the adjacent window having a window No. smaller by 1 than the window No. of said each window, and each window shares eight registers R24 to R31 with the adjacent window having a window No. greater by 1 than the window No. of said each window. The remaining eight registers R16 to R23 are inherent in each window and are not overlappingly contained in other window.

Figure 12:
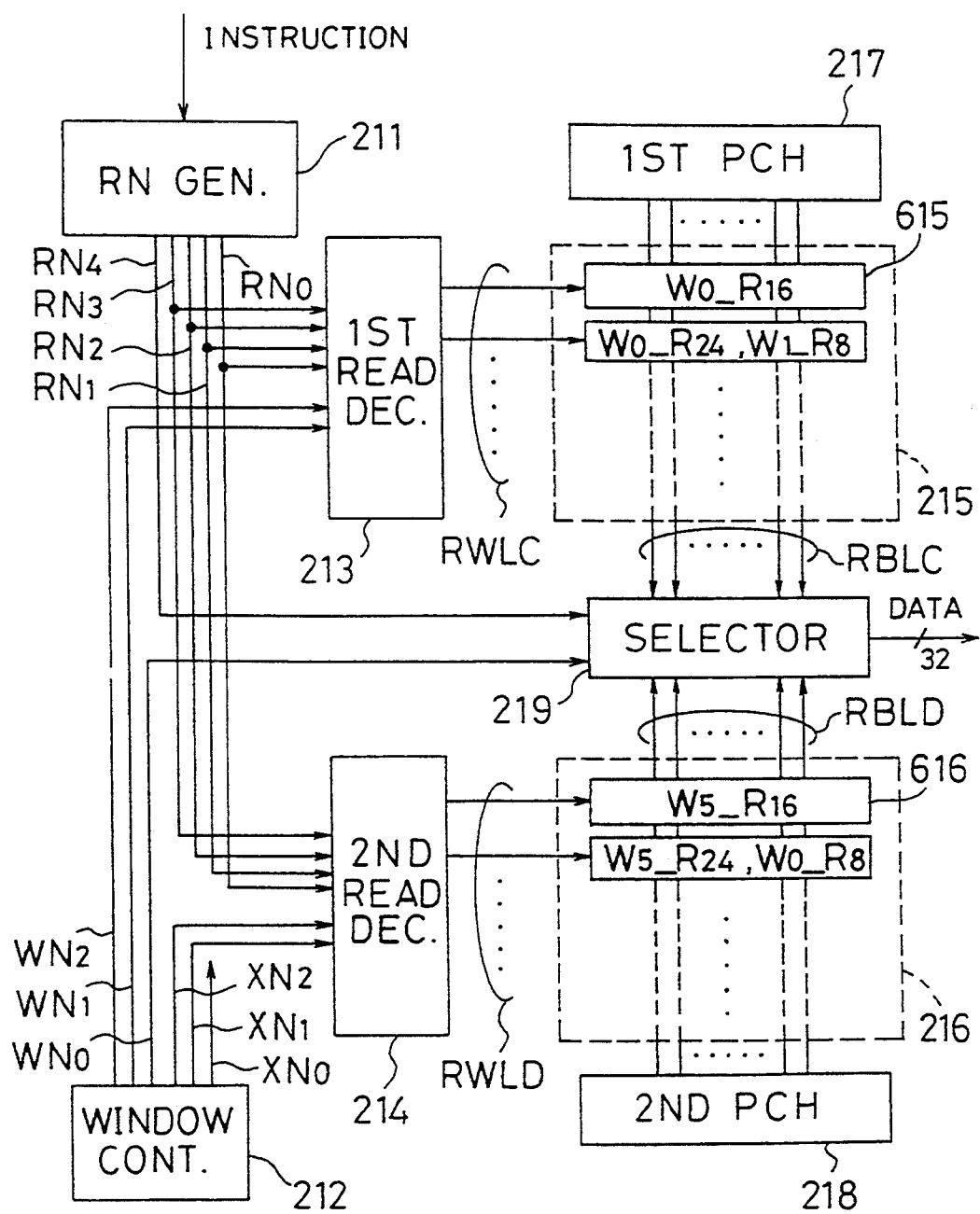
FIG. 12 is a block diagram illustrating the arrangement of reading circuits in the register file according to the fifth embodiment of the present invention.

In FIG. 12, 96 registers belonging to the windows are divided into first and second memory cell arrays 215, 216 according to the least significant bits of window Nos. and the most significant bits of register addresses. More specifically, the first memory cell array 215 contains the latter-half registers R16 to R31 of even-numbered windows, and the second memory cell array 216 contains the latter-half registers R16 to R31 of odd-numbered windows. A half of the latter-half registers R16 to R31 of the even-numbered windows overlaps the eight first-half registers R8 to R15 of the odd-numbered windows, and a half of the latter-half registers R16 to R31 of the odd-numbered windows overlaps the eight first-half registers R8 to R15 of the even-numbered windows. Each of 48 registers 615 (W0_R24, W1_R8 and the like) in the first memory cell array 215 has one first read word line RWLC, and these 48 registers 615 share 32 first read bit lines RBLC with one another. Each of 48 registers 616 (W5_R24, W0_R8 and the like) in the second memory cell array 216 has one second read word line RWLD, and these 48 registers 616 share, with one another, 32 second read bit lines RBLD which are different from the first read bit lines RBLC.

A register address signal generating circuit 211 is adapted to receive an instruction signal, from which a register address (8 to 31) is taken out to generate a 5-bit register address signal RN4 to RN0. A window control circuit 212 is adapted to supply a 3-bit window No. signal WN2 to WN0 representing the current window No. (0 to 5) and also to supply a corrected window No. signal XN2 to XN0 obtained by adding 1 to the current window No. It is noted here that, when the current window No. is 5, the corrected window No. is not 6 but is 0. A first read decoding circuit 213 is adapted to receive total 6 bits including a window No. signal WN2 to WN1 with the least significant bit thereof excepted, and a register address signal RN3 to RN0 with the most significant bit thereof excepted, thereby to assert one of the 48 first read word lines RWLC. A second read decoding circuit 214 is adapted to receive total 6 bits including a corrected window No. signal XN2 to XN1 with the least significant bit thereof excepted, and a register address signal RN3 to RN0 with the most significant bit thereof excepted, thereby to assert one of the 48 second read word lines RWLD.

Tables 8, 9 show decoding methods for the first and second read decoding circuits 213, 214.

TABLE 8

| RWLC | WN2~0 | RN4~0 | | Register to be Selected |
|---|---|---|---|---|
| 1 | 0 or 1 (00x) | 16 | (x0000) | W0_R16 |
| 2 | 0 or 1 (00x) | 17 | (x0001) | W0_R17 |
| . | . | . | . | . |
| 8 | 0 or 1 (00x) | 23 | (x0111) | W0_R23 |
| 9 | 2 or 3 (01x) | 16 | (x0000) | W2_R16 |
| 10 | 2 or 3 (01x) | 17 | (x0001) | W2_R17 |
| . | . | . | . | . |
| 16 | 2 or 3 (01x) | 23 | (x0111) | W2_R23 |
| 17 | 4 or 5 (10x) | 16 | (x0000) | W4_R16 |
| 18 | 4 or 5 (10x) | 17 | (x0001) | W4_R17 |
| . | . | . | . | . |

TABLE 8-continued

| RWLC | WN2~0 | RN4~0 | | Register to be Selected | |
|---|---|---|---|---|---|
| . | . | . | . | . | |
| 23 | 4 or 5 (10x) | 23 | (x0111) | W4_R23 | |
| 24 | 0 or 1 (00x) | 8 or 24 | (x1000) | W0_R24 | W1_R8 |
| 25 | 0 or 1 (00x) | 9 or 25 | (x1001) | W0_R25 | W1_R9 |
| . | . | . | . | . | . |
| 32 | 0 or 1 (00x) | 15 or 31 | (x1111) | W0_R31 | W1_R15 |
| 33 | 2 or 3 (01x) | 8 or 24 | (x1000) | W2_R24 | W3_R8 |
| 34 | 2 or 3 (01x) | 9 or 25 | (x1001) | W2_R25 | W3_R9 |
| . | . | . | . | . | . |
| 40 | 2 or 3 (01x) | 15 or 31 | (x1111) | W2_R31 | W3_R15 |
| 41 | 4 or 5 (10x) | 8 or 24 | (x1000) | W4_R24 | W5_R8 |
| 42 | 4 or 5 (10x) | 9 or 25 | (x1001) | W4_R25 | W5_R9 |
| . | . | . | . | . | . |
| 48 | 4 or 5 (10x) | 15 or 31 | (x1111) | W4_R31 | W5_R15 |

TABLE 9

| RWLD | WN2~0 | RN4~0 | | Register to be Selected | |
|---|---|---|---|---|---|
| 1 | 0 or 1 (00x) | 16 | (x0000) | W5_R16 | |
| 2 | 0 or 1 (00x) | 17 | (x0001) | W5_R17 | |
| . | . | . | . | . | |
| 8 | 0 or 1 (00x) | 23 | (x0111) | W5_R23 | |
| 9 | 2 or 3 (01x) | 16 | (x0000) | W1_R16 | |
| 10 | 2 or 3 (01x) | 17 | (x0001) | W1_R17 | |
| . | . | . | . | . | |
| 16 | 2 or 3 (01x) | 23 | (x0111) | W1_R23 | |
| 17 | 4 or 5 (10x) | 16 | (x0000) | W3_R16 | |
| 18 | 4 or 5 (10x) | 17 | (x0001) | W3_R17 | |
| . | . | . | . | . | |
| 23 | 4 or 5 (10x) | 23 | (x0111) | W3_R23 | |
| 24 | 0 or 1 (00x) | 8 or 24 | (x1000) | W5_R24 | W0_R8 |
| 25 | 0 or 1 (00x) | 9 or 25 | (x1001) | W5_R25 | W0_R9 |
| . | . | . | . | . | . |
| 32 | 0 or 1 (00x) | 15 or 31 | (x1111) | W5_R31 | W0_R15 |
| 33 | 2 or 3 (01x) | 8 or 24 | (x1000) | W1_R24 | W2_R8 |
| 34 | 2 or 3 (01x) | 9 or 25 | (x1001) | W1_R25 | W2_R9 |
| . | . | . | . | . | . |
| 40 | 2 or 3 (01x) | 15 or 31 | (x1111) | W1_R31 | W2_R15 |
| 41 | 4 or 5 (10x) | 8 or 24 | (x1000) | W3_R24 | W4_R8 |
| 42 | 4 or 5 (10x) | 9 or 25 | (x1001) | W3_R25 | W4_R9 |
| . | . | . | . | . | . |
| 48 | 4 or 5 (10x) | 15 or 31 | (x0111) | W3_R31 | W4_R15 |

FIG. 12 also shows first and second precharging circuits 217, 218 for pre-charging the first and second read bit lines RBLC, RBLD. An output selection circuit (SELECTOR) 219 is adapted to select, as an output data, a data on the first read bit lines RBLC when the exclusive logical sum of the least significant bit WN0 of a window No. signal and the most significant bit RN4 of a register address signal is equal to 1, and a data on the second read bit lines RBLD when the exclusive logical sum above-mentioned is equal to 0.

For example, a data stored in W5_R25 (W0_R9) will be read in the following manner. When the current window No. is 5 (the corrected window No. is 0) and an instruction signal designates to read the register having a register address 25, data are read not only from W5_R25 (W0_R9) to the second read bit lines RBLD in the second memory cell array 216, but also from W5_R9 (W4_R25) to the first read bit lines RBLC in the first memory cell array 215. However, since the exclusive logical sum of the least significant bit WN0 of a window No. signal and the most significant bit RN4 of a register address signal is equal to 0, the output selection circuit 219 selects the second read bit lines RBLD and the data read from W5_R25 (W0_R9), as an output data.

According to the fifth embodiment as discussed in the foregoing, even though the number of windows is other numeral than a continued product of 2, there can be provided a register file having an overlap-window arrangement, which is reduced in circuit scale and assures high-speed reading. Likewise in the third and fourth embodiments, the lower three bits of a value obtained by subtracting 1 from the current window No. can be used as a corrected window No. signal XN2 to XN0. However, when the current window No. is 0, the corrected window No. signal is exceptionally set to 5. Also, provision may be made such that the output selection circuit 219 selects an output data according to the exclusive logical sum of the least significant bit XN0 of a corrected window No. signal and the most significant bit RN4 of a register address signal. However, when the exclusive logical sum above-mentioned is equal to 1, a data on the second read bit lines RBLD is selected as an output data, and when the exclusive logical sum above-mentioned is equal to 0, a data on the first read bit lines RBLC is selected as an output data.

Even in a register file having a window arrangement in which non-overlapping portions are absent as in the third embodiment, the present invention can be applied to such a register file having windows of which number is other numeral than a continued product of 2, as far as there is taken, for a corrected window No., an exception measure similar to that in the fifth embodiment.

In each of the second to fifth embodiments, the memory cells may be further divided according to odd- and even-numbered register addresses. For example, in the second embodiment, a first memory cell array may contain registers R8, R10, R12, R14 of even-numbered windows (registers R0, R2, R4, R6 of odd-numbered windows), a second memory cell array may contain registers R9, R11, R13, R15 of even-numbered windows (registers R1, R3, R5, R7 of odd-numbered windows), a third memory cell array may contain registers R0, R2, R4, R6 of even-numbered windows (registers R8, R10, R12, R14 of odd-numbered windows) and a fourth memory cell array may contain registers R1, R3, R5, R7 of even-numbered windows (registers R9, R11, R13, R15 of odd-numbered windows). In such an arrangement, the output selection circuit is adapted to select an output data from four data according to the least significant bit WN0 of a window No. signal, the most significant bit RN3 of a register address signal and the least significant bit RN0 of the register address signal. Such an arrangement further shortens the read bit lines of the memory cell arrays to reduce the wiring capacitances thereof, thus further speeding up register reading.

I claim:

1. In a register file having a plurality of registers which are divided into a plurality of windows L adjacent to each other, each of said plurality of windows containing a plurality of registers K, each of said plurality of windows sharing some of said registers as double-address registers with two adjacent windows, each register in each window being designated by a window number which identifies each window in each of said plurality of windows containing said register, and by a register address which indicates a relative position of said register in said each window, said register file comprising:

a first memory cell array having, as first words, memory cells for a half of said double-address registers, said first words sharing first read bit lines with one another;

a second memory cell array having, as second words, memory cells for the remaining half of said double-address registers, said second words sharing, with one another, second read bit lines which are different from said first read bit lines;

a window control circuit for supplying a window number signal to specify said window number of M-bits;

a register address signal generating circuit for generating a register address signal to specify said register address of N-bits;

first and second read decoding circuits for respectively selecting one of said first words and one of said second words according to said window number signal from said window control circuit and said register address signal from said register address signal generating circuit; and an output selection circuit for selecting, as an output data, either a data read from said one of said first words to said first read bit lines, or a data read from said one of said second words to said second read bit lines.

2. A register file according to claim 1, wherein:

the first memory cell array has, as the first words, memory cells for those registers, out of the double-address registers, to be designated by register address signals of which the least significant bits are 0, each of said first words having two first read word lines;

the second memory cell array has, as the second words, other memory cells for those registers, out of said double-address registers, to be designated by register address signals of which the least significant bits are 1, each of said second words having two second read word lines;

the first and second read decoding circuits are adapted to respectively assert one of said first read word lines and one of said second read word lines based on all the bits of given window number signal and all the bits of a given register address signal except for the least significant bit thereof; and the output selection circuit is adapted to select, as said output data, a data on said first read bit lines when the least significant bit of said given register address signal is 0, and a data on said second read bit lines when the least significant bit of said given register address signal is 1.

3. A register file according to claim 1, wherein:

the first memory cell array has, as the first words, memory cells for those registers, out of the double-address registers, which are designated by window number signals of which the least significant bits are 0, and by register address signals of which the most significant bits are 1, and which are designated by window number signals of which the least significant bits are 1, and by register address signals of which the most significant bits are 0, each of said first words having a single first read word line;

the second memory cell array has, as the second words, other memory cells for those registers, out of said double-address registers, which are designated by window number signals of which the least significant bits are 0, and by register address signals of which the most significant bits are 0, and which are designated by window number signals of which the least significant bits are 1, and by register address signals of which the most significant bits are 1, each of said second words having a single second read word line;

the first and second read decoding circuits are adapted to respectively assert one of said first read word lines and one of said second read word lines based on all the bits of a given window number signal and all the bits of a given register address signal except for the most significant bit thereof; and the output selection circuit is adapted to select, as said output data, a data on said first read bit lines when the least significant bit of said given window number signal is not identical with the most significant bit of said given register address signal, and a data on said second read bit lines when the least significant bit of said given window number signal is identical with the most significant bit of said given register address signal.

4. A register file according to claim 1, wherein:

the first memory cell array has, as the first words, memory cells for those registers, out of the double-address registers, which are designated by window number signals of which the least significant bits are 0, and by register address signals of which the most significant bits are 1, and which are designated by window number signals of which the least significant bits are 1, and by register address signals of which the most significant bits are 0, each of said first words having a single first read word line;

the second memory cell array has, as the second words, other memory cells for those registers, out of said double-address registers, which are designated by window number signals of which the least significant bits are 0, and by register address signals of which the most significant bits are 0, and which are designated by window number signals of which the least significant bits are 1, and by register address signals of which the most significant bits are 1, each of said second words having a single second read word line;

the window control circuit is further adapted to supply a corrected window number signal to specify said corrected window number of M-bits which indicates an adjacent window of the window designated by said window number;

the first read decoding circuit is adapted to assert one of said first read word lines based on all the bits of a given window number signal except for the least significant bit thereof and all the bits of a given register address signal except for the most significant bit thereof;

the second read decoding circuit is adapted to assert one of said second read word lines based on all the bits of a given corrected window number signal except for the least significant bit thereof and all the bits of a given register address signal except for the most significant bit thereof; and the output selection circuit is adapted to select, as said output data, a data on said first read bit lines when the least significant bit of said given window number signal is not identical with the most significant bit of said given register address signal, or when the least significant bit of said given corrected window number signal is identical with the most significant bit of said given register address signal, and a data on said second read bit lines when the least significant bit of said given window number signal is identical with the most significant bit of said given register address signal, or when the least significant bit of said given corrected window number signal is not identical with the most significant bit of said given register address signal.

5. A register file according to claim 4, wherein, when the number of windows L satisfies the relationship in which L is equal to or smaller than $2^M$ (wherein M is the number of bits of said given window number signal or said given corrected window number signal), the window control circuit uses, as said corrected window number of M-bits, a value obtained by adding 1 to said given window number of M-bits when said given window number is any value from 0 to (L−2), and 0 when said given window number is (L−1).

6. A register file according to claim 4, wherein, when the number of windows L satisfies the relationship in which L is equal to or smaller than $2^M$ (wherein M is the number of bits of said given window number signal or a said given corrected window number signal), the window control circuit uses, as said corrected window number of M-bits, a value obtained by subtracting 1 from said given window number when said given window number is any value from 1 to (L−1), and (L−1) when said given window number is 0.

* * * * *